United States Patent
Shilimkar et al.

(10) Patent No.: US 10,574,198 B2
(45) Date of Patent: Feb. 25, 2020

(54) INTEGRATED CIRCUIT DEVICES WITH SELECTIVELY ARRANGED THROUGH SUBSTRATE VIAS AND METHOD OF MANUFACTURE THEREOF

(71) Applicant: NXP USA, INC., Austin, TX (US)

(72) Inventors: Vikas Shilimkar, Chandler, AZ (US); Daniel Joseph Lamey, Chandler, AZ (US); Kevin Kim, Gilbert, AZ (US)

(73) Assignee: NXP USA, Inc., Austin, TX (US)

( * ) Notice: Subject to any disclaimer, the term of this patent is extended or adjusted under 35 U.S.C. 154(b) by 0 days.

(21) Appl. No.: 15/389,252

(22) Filed: Dec. 22, 2016

(65) Prior Publication Data

US 2018/0182717 A1 Jun. 28, 2018

(51) Int. Cl.
| | |
|---|---|
| H01L 23/66 | (2006.01) |
| H03F 3/213 | (2006.01) |
| H01L 49/02 | (2006.01) |
| H01L 29/78 | (2006.01) |
| H03F 3/195 | (2006.01) |

(52) U.S. Cl.
CPC ............. *H03F 3/213* (2013.01); *H01L 23/66* (2013.01); *H01L 28/10* (2013.01); *H01L 28/60* (2013.01); *H01L 29/7816* (2013.01); *H03F 3/195* (2013.01); *H01L 2223/6616* (2013.01); *H01L 2223/6655* (2013.01); *H01L 2223/6666* (2013.01); *H03F 2200/222* (2013.01); *H03F 2200/387* (2013.01); *H03F 2200/451* (2013.01)

(58) Field of Classification Search
CPC ....... H01L 2924/00; H01L 2924/00014; H01L 2924/181; H01L 2924/12042; H01L 2924/1306
See application file for complete search history.

(56) References Cited

U.S. PATENT DOCUMENTS

| | | | |
|---|---|---|---|
| 8,136,084 B2 | 3/2012 | Dean et al. | |
| 2009/0309212 A1* | 12/2009 | Shim, II | H01L 21/568 257/700 |

(Continued)

FOREIGN PATENT DOCUMENTS

| | | |
|---|---|---|
| KR | 20100003911 A | 1/2010 |
| KR | 101458977 B1 | 11/2014 |

OTHER PUBLICATIONS

Allen, Richard; Laying the Groundwork for 3D Stacked Integrated Circuits; Feb. 17, 2012; The National Institute of Standards and Technology (NIST); United States.

(Continued)

*Primary Examiner* — Tony Tran

(57) ABSTRACT

An integrated circuit device includes a device substrate having first and second opposing surfaces, a first component electrode coupled to the first surface, and a conductive plane coupled to the second surface. The integrated circuit device also includes a plurality of through substrate vias electrically coupling a first region of the first component electrode to the conductive plane through the device substrate, wherein a second adjacent region of the first component electrode is substantially devoid of through substrate vias. Arrangement of the plurality of through substrate vias in the first region is based on a projected current distribution through the first component electrode when the integrated circuit device is operational.

16 Claims, 10 Drawing Sheets

(56) References Cited

U.S. PATENT DOCUMENTS

| | | |
|---|---|---|
| 2012/0025388 A1 | 2/2012 | Law et al. |
| 2014/0145326 A1* | 5/2014 | Lin .................. H01L 24/11 |
| | | 257/737 |
| 2015/0028482 A1 | 1/2015 | Ning et al. |
| 2016/0087588 A1* | 3/2016 | Szymanowski ......... H01L 23/66 |
| | | 330/307 |

OTHER PUBLICATIONS

K. H. Lu, X. Zhang, S. K. Ryu, R. Huang, P. S. Ho, Thermal Stresses Analysis of 3-D Interconnect. In: 10th International Workshop on Stress-Induced Phenomena in Metallization. AIP Conf. Proc. 1143, 224-230 (2009).

M. Pathak, Y. J. Lee, T. Moon and S. K. Lim, "Through-silicon-via management during 3D physical design: When to add and how many?," Computer-Aided Design (ICCAD), 2010 IEEE/ACM International Conference on, San Jose, CA, 2010, pp. 387-394.

Shrout, R., High Bandwidth Memory (HBM) Architecture—AMD Plans for the Future of GPUs, May 19, 2015.

* cited by examiner

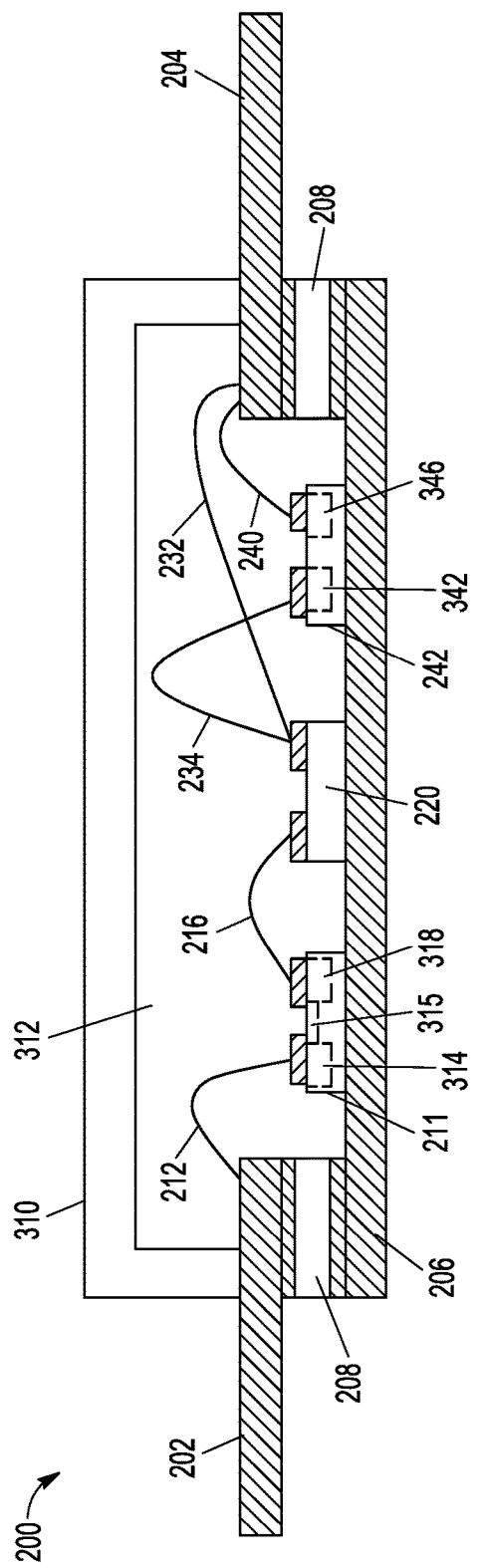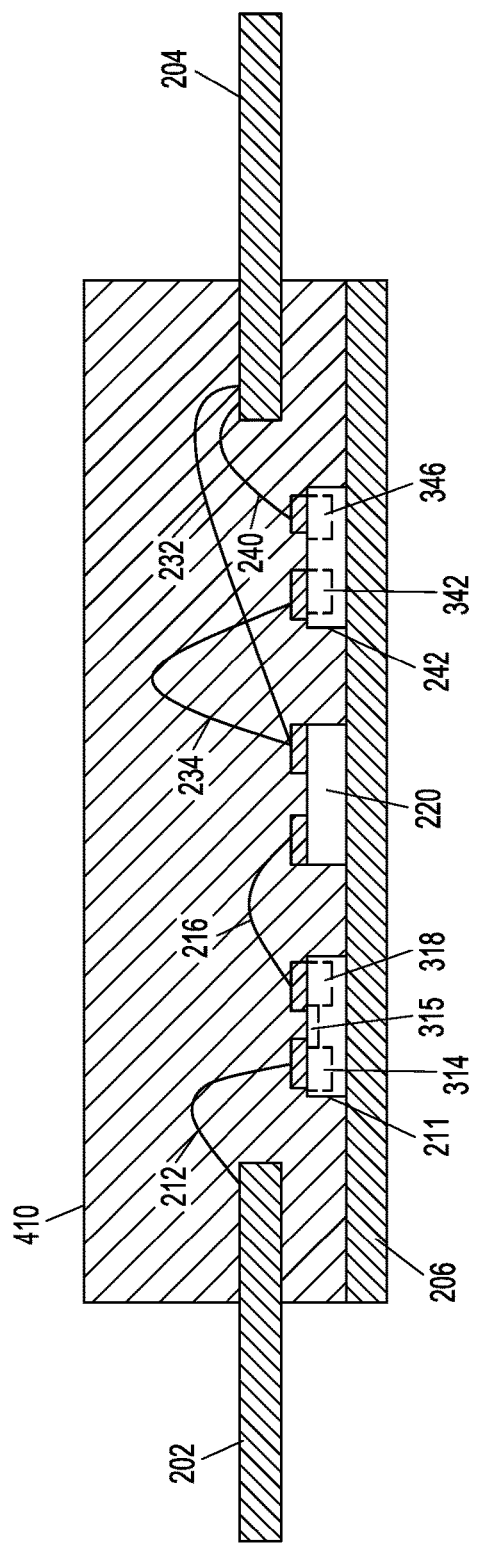

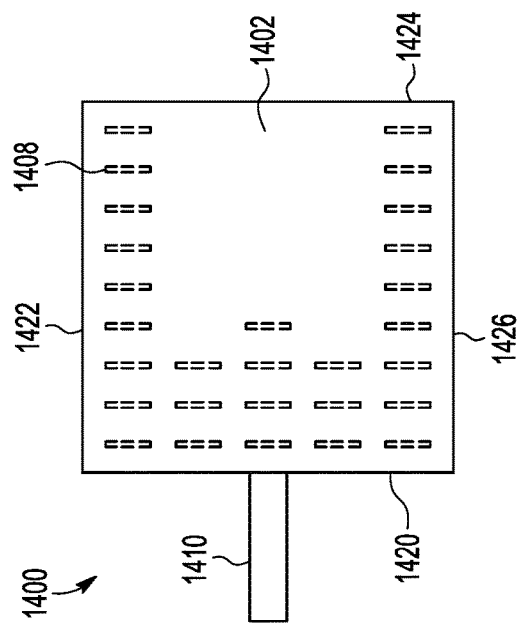
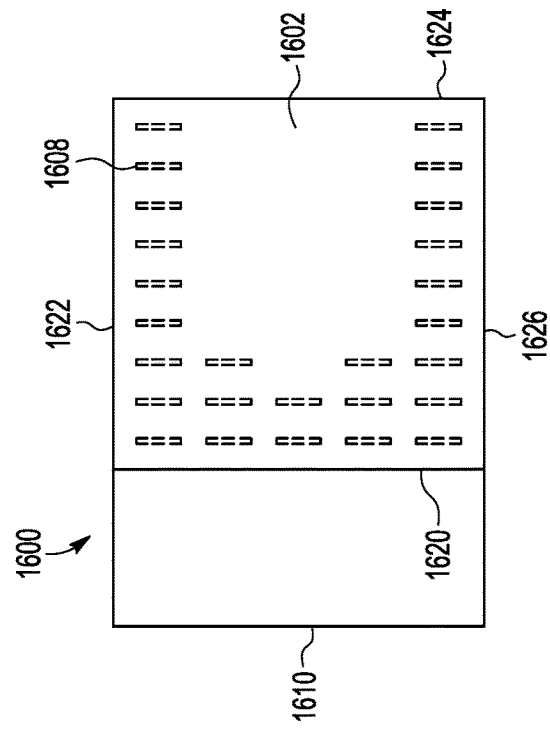
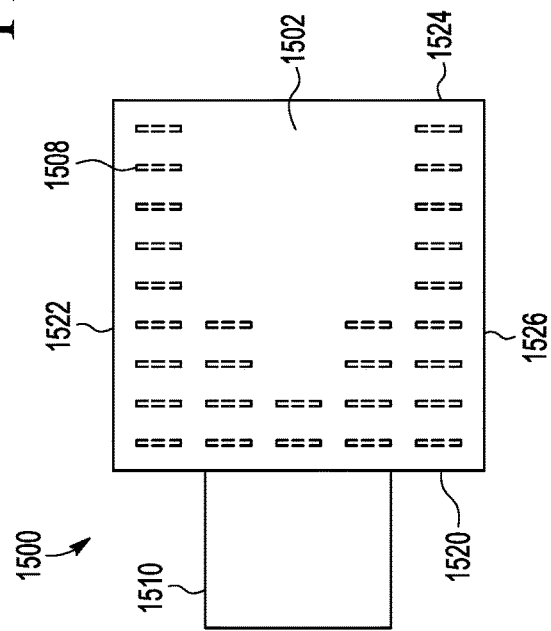

INTEGRATED CIRCUIT DEVICES WITH SELECTIVELY ARRANGED THROUGH SUBSTRATE VIAS AND METHOD OF MANUFACTURE THEREOF

TECHNICAL FIELD

Embodiments of the subject matter described herein relate generally to integrated circuits, the arrangement of through substrate vias that are incorporated into integrated circuits, and methods of their manufacture.

BACKGROUND

Through substrate vias (TSVs), such as through silicon vias, are used to provide connections in integrated circuits (ICs). For example, a main application of TSVs in radio frequency (RF) ICs is the connection of various components, such as shunt capacitors and shunt inductors, to a back plane metallization or conductive plane, which can serve as an electrical ground.

A shortcoming, however, of inserting TSVs in the IC is the production of stress in the substrate due to differences in the coefficients of thermal expansion between the material of the TSVs and the substrate material. This thermally induced mechanical stress has been found to increase as the number of TSVs in a die increases. Moreover, this stress commonly results in issues such as die cracking that can impact the yield and reliability of the IC manufacturing process.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

FIG. 3 is a cross-sectional, side view of the RF amplifier device of FIG. 2 along line 3-3;

FIG. 4 is a cross-sectional, side view of an RF amplifier device, in accordance with an alternate embodiment;

FIG. 14 is a top view of a portion of an integrated circuit device having a component and an example arrangement of TSVs, in accordance with an alternate embodiment;

FIG. 15 is a top view of a portion of an integrated circuit device having a component and an example arrangement of TSVs, in accordance with an alternate embodiment;

FIG. 16 is a top view of a portion of an integrated circuit device having a component and an example arrangement of TSVs, in accordance with an alternate embodiment;

DETAILED DESCRIPTION

Figure 10:
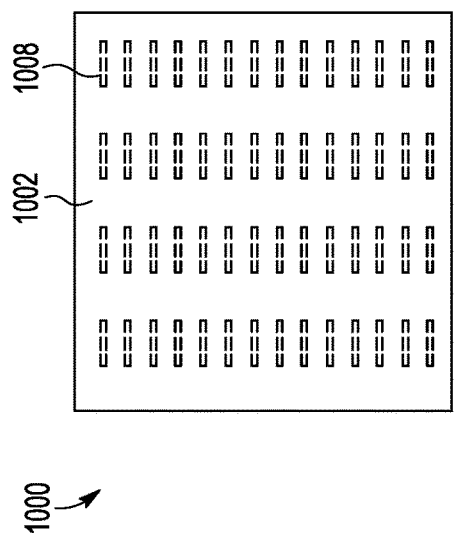
FIG. 10 is a top view of a portion of an integrated circuit device having a component and a prior art arrangement of TSVs.

Integrated circuit devices, such as radio frequency (RF) power amplifier devices and monolithic dies that include one or more transistor stages, can include one or more components that are coupled using a plurality of TSVs to a conductive plane, such as a back plane metallization used for electrical ground. FIG. 10 shows a top view of a portion of an integrated circuit device 1000 having a component coupled to a prior art arrangement of TSVs 1008. More particularly, the TSVs 1008 extend in a primary direction between first and second ends, where the first ends are connected to a component electrode 1002, and the second ends may be connected to back plane metallization that is in a parallel plane to the component electrode. Across a plane that is parallel to the component electrode 1002, the rows and/or columns of TSVs 1008 are equidistant or substantially equidistant across most of the surface of the component electrode 1002. Said another way, the cross-sectional density of TSVs 1008 (per electrode unit area) is substantially uniform across a plane that is parallel to the plane of the component electrode 1002.

As used herein, a 'component electrode' is a conductive feature of an electrical component or directly coupled to an electrical component, where the component electrode has a substantially planar area that is parallel to a surface of a semiconductor substrate and perpendicular to a primary direction in which the TSVs extend. In FIG. 10, TSVs 1008 underlie the component electrode 1002, and the first ends the TSVs 1008, which are directly connected to the component electrode 1002, are shown with dashed lines.

According to some embodiments is a selective non-uniform arrangement of TSVs coupled between a component electrode and a conductive plane. Namely, all of a plurality of TSVs coupled between the component electrode and the conductive plane are coupled in a first region of the component electrode, while a second adjacent region of the component electrode is substantially devoid of TSVs. As used herein, the term "substantially devoid of TSVs" as it is used in the context of comparing the prevalence of TSVs coupled to a first region and to a second region of a component electrode, means that the density (per electrode unit area) of TSVs coupled to the second region is either zero or is significantly less than the density of TSVs coupled to the first region. More specifically, according to various embodiments, whereas the density of TSVs coupled to a first area of a component electrode may be described as X TSVs per unit area (e.g., per square micron or as a percentage of the entire area of the component electrode), the density of TSVs coupled to an adjacent second area of the component electrode may be in the range of 0 to 0.5X TSVs per unit area. According to an embodiment, the density of TSVs in a first area is in a range of about 5 percent TSVs to about 20 percent TSVs of the entire area of the component electrode, although the density could be larger or smaller, as well.

According to various embodiments, the total area of the first region (or all first regions, if there are multiple first regions) is between 20 percent and 80 percent of the total area of the component electrode, and accordingly the total area of the adjacent second region (or all second regions, if there are multiple second regions) is between 80 percent and 20 percent of the total area of the component electrode. Further, for a region to be considered a "first region," the region must include at least two TSVs, in an embodiment. In another embodiment, for a region to be considered a "first region," the region must include at least ten TSVs. The boundary between a first region and an adjacent second region is defined as a line that demarcates a significant change in the density of TSVs.

The non-uniform arrangement or placement of TSVs relative to the component electrode is based on, e.g., corresponds to, correlates with, or is aligned with, a projected current distribution through the component electrode when the component electrode is operational. By, thus, selectively arranging the TSVs, the number of TSVs can be reduced as compared to the prior art arrangement of TSVs while maintaining or substantially maintaining circuit performance parameters, such as, but not limited to, capacitance and quality ("Q") factor. The decreased number of TSVs in the die can mitigate against die cracking and enable improved yield and reliability during the IC manufacturing process.

Figure 1:
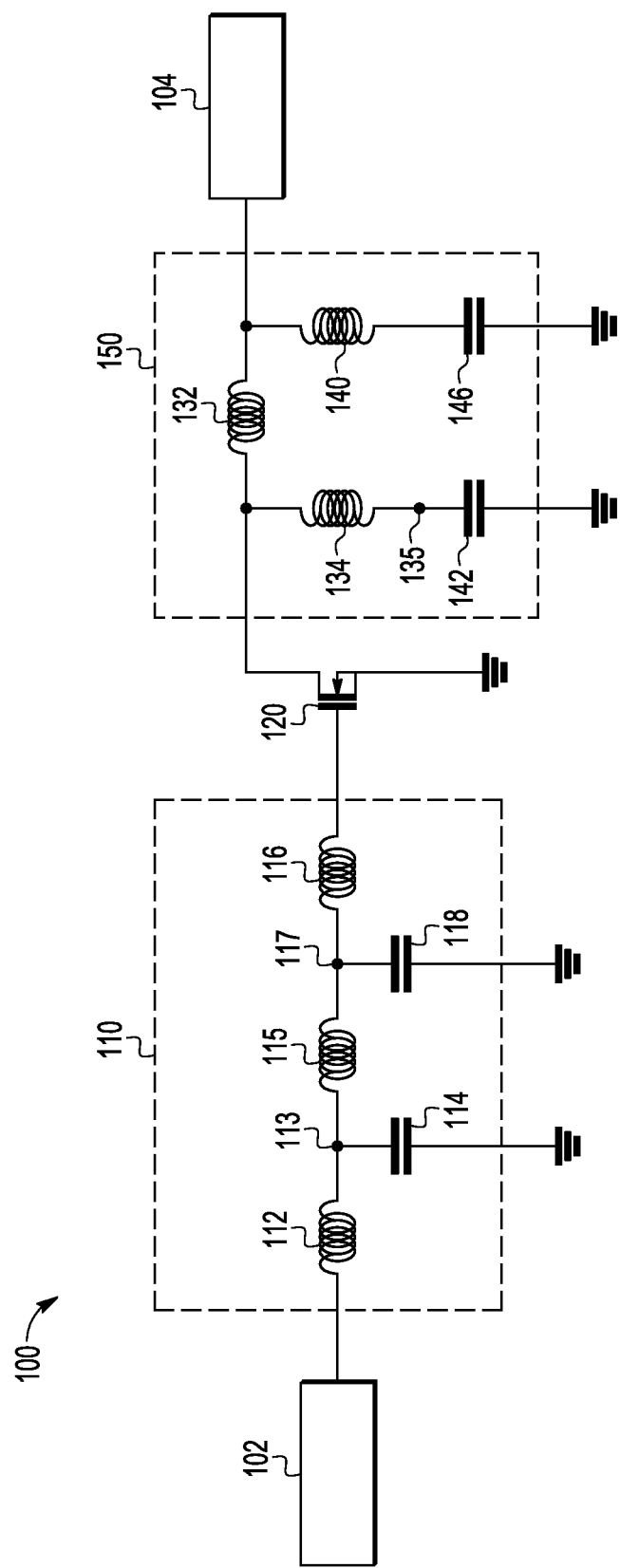
FIG. 1 is a schematic diagram of a radio frequency (RF) power amplifier circuit with at least one component having an arrangement of through substrate vias (TSVs), in accordance with an embodiment.

FIG. 1 is a schematic diagram of an RF amplifier device 100. Device 100 includes an input lead 102, an input impedance matching circuit 110, a transistor 120, an output impedance matching circuit 150, and an output lead 104, in an embodiment. Although transistor 120 and various elements of the input and output impedance matching circuits 110, 150 are shown as singular components, the depiction is for the purpose of ease of explanation only. Those of ordinary skill in the art would understand, based on the description herein, that transistor 120 and/or certain elements of the input and output impedance matching circuits 110, 150 each may be implemented as multiple components (e.g., connected in parallel or in series with each other), and examples of such embodiments are illustrated in other Figures and described later.

For example, embodiments may include single-path devices (e.g., including a single input lead, output lead, transistor, etc.), dual-path devices (e.g., including at least two input leads, at least two output leads, transistors, etc.), and/or multi-path devices (e.g., including more than two input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits 110, 150, below, are thus not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120. Transistor 120 also is located within the interior of the device's package. Output impedance matching circuit 150 is electrically coupled between a second terminal of transistor 120 and the output lead 104, and output impedance matching circuit 150 is also located within the interior of the device's package.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). In a more specific embodiment, transistor 120 may be a laterally diffused MOSFET (LDMOSFET), with bonding pads to the gate and to a first current conducting terminal (e.g., the drain) at a top surface of the transistor 120, and with an electrical connection to the second current conducting terminal (e.g., the source) at a bottom surface of the transistor 120. Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively).

According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150, and the source of transistor 120 is coupled to ground (or another voltage reference). Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the printed circuit board level (PCB-level) matching interface from a driver stage to have an impedance that can be achieved in high-volume manufacturing with minimal loss and variation (e.g., a "user friendly" matching interface). Input impedance matching circuit 110 is coupled between the input lead 102 and the control terminal (e.g., gate) of the transistor 120.

According to an embodiment, input impedance matching circuit 110 is a low-pass filter circuit. More specifically, input impedance matching circuit 110 includes three inductive elements 112, 115, 116 (e.g., two sets of bondwires and an integrated inductor) and two shunt capacitors 114, 118, in an embodiment. A first inductive element 112 (e.g., a first set of bondwires) is coupled between input lead 102 and a first node 113. A second inductive element 115 (e.g., an integrated inductor) is coupled between the first node 113 and a second node 117. A third inductive element 116 (e.g., a second set of bondwires) is coupled between the second node 117 and the control terminal of transistor 120. A first electrode of a first capacitor 114 is coupled to the first node 113, and a second electrode of the first capacitor 114 is coupled to ground (or another voltage reference). A first electrode of a second capacitor 118 is coupled to the second node 117, and a second electrode of the second capacitor 118 is coupled to ground (or another voltage reference). In an alternate embodiment, the integrated inductor 115 and the capacitor 118 can be excluded altogether from the device 100, and a single inductive element 112 or 116 (e.g., a single set of bondwires) can couple the input lead 102 to the gate of the transistor 120.

According to an embodiment, first inductive element 112 may have a value in a range between about 50 picohenries (pH) to about 400 pH, second inductive element 115 may have a value in a range between about 100 pH to about 400 pH, third inductive element 116 may have a value in a range between about 30 pH to about 200 pH, shunt capacitor 114 may have a value in a range between about 10 picofarads (pF) to about 30 pF, and shunt capacitor 118 may have a value in a range between about 60 pF to about 120 pF. The inductance and capacitance values of inductive elements 112, 115, 116 and capacitors 114, 118 can be selected to determine the impedance transformation between the input and output of circuit 110 over a desired bandwidth, and ranges for these values may be different, in other embodiments.

Output impedance matching circuit 150 is configured to match the output impedance of device 100 with the input impedance of an external circuit or component (not shown) that may be coupled to output lead 104. Output impedance matching circuit 150 is coupled between the first current conducting terminal (e.g., drain) of transistor 120 and the output lead 104. According to an embodiment, output impedance matching circuit 150 is a shunt-inductance (shunt-L) high-pass filter circuit. More specifically, output impedance matching circuit 150 includes three inductive elements 132, 134, 140 (e.g., three sets of bondwires) and two capacitors 142, 146, in an embodiment. A first inductive element 132 (e.g., a third set of bondwires), is coupled between the first current conducting terminal (e.g., drain) of transistor 120 and the output lead 104. A second inductive element 134 (e.g., a fourth set of bondwires) is coupled between the first current conducting terminal of transistor 120 and a third node 135. A first electrode of a first capacitor 142 is coupled to the third node 135. A third inductive element 140 (e.g., a fifth set of bondwires) is coupled between the output lead 104 and a first electrode of a second capacitor 146. Second electrodes of capacitors 142, 146 are coupled to ground (or to another voltage reference), in an embodiment.

Inductive element 134 and capacitor 142 are coupled in series between a current conducting terminal of transistor 120 and ground, and this combination of impedance matching elements functions as a first (high-pass) matching stage. According to an embodiment, inductive element 134 may have a value in a range between about 100 pH to about 3 nH, and shunt capacitor 142 may have a value in a range between about 50 pF to about 500 pF, although these components may have values outside of these ranges as well.

An RF "cold point" is present at the node 135 between shunt inductive element 134 and shunt capacitor 142, where the RF cold point represents a high impedance point in the circuit. Although not shown in FIG. 1, device 100 also may include an envelope frequency termination circuit (e.g., a series coupled inductive element, resistor, and capacitor) coupled between the RF cold point (at node 135) and ground (or another voltage reference). The envelope frequency termination circuit may function to improve the low frequency resonance of device 100 caused by the interaction between the output impedance matching circuit 150 and bias feeds (not shown) by presenting a high impedance at RF frequencies.

Inductive element 140 and capacitor 146 are coupled in series between the output lead 104 and ground (or another voltage reference), and this combination of impedance matching elements functions as a second (low-pass) matching stage. According to an embodiment, inductive element 140 may have a value in a range between about 50 pH to about 1 nH, and capacitor 146 may have a value in a range between about 1 pF to about 50 pF, although these components may have values outside of these ranges, as well. In an alternate embodiment, inductive element 140 and capacitor 146 may be excluded altogether from device 100.

Figure 2:
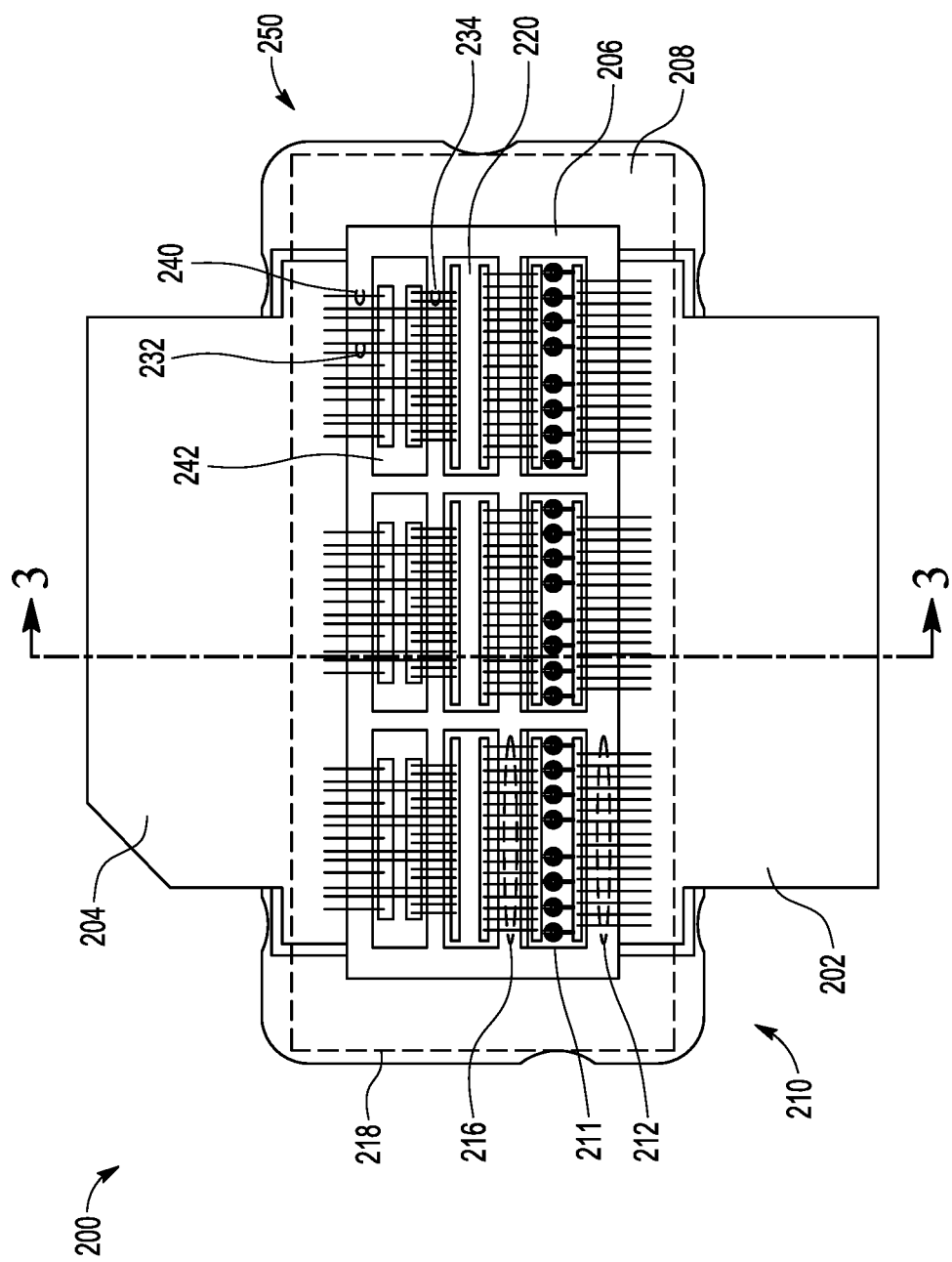
FIG. 2 is a top view of an example packaged RF amplifier device that embodies the circuit of FIG. 1, in accordance with an embodiment.

FIG. 2 is a top view of an example packaged RF amplifier device 200 that embodies multiple parallel amplification paths. Namely, device 200 includes an input lead 202 (e.g., input lead 102, FIG. 1), an output lead 204 (e.g., output lead 104, FIG. 1), a flange 206, multiple transistors 220 (e.g., transistor 120, FIG. 1), multiple input impedance matching circuits 210 (e.g., input impedance matching circuit 110, FIG. 1), and multiple output impedance matching circuits 250 (e.g., output impedance matching circuit 150, FIG. 1), all of which may be packaged together as parts of the device 200. As shown, each input impedance matching circuit 210 includes an input-side integrated passive device (IPD) 211 and additional impedance matching elements 212 and 216. Similarly, each output impedance matching circuit 250 includes an output-side IPD 242 and additional impedance matching elements 232, 234, and 240.

Accordingly, for this example implementation, RF amplifier device 200 embodies multiple parallel instances of the circuit of FIG. 1. More particularly, interconnected electrical components and elements of device 200 along each of three amplification paths can be modeled by the schematic diagram of FIG. 1. Therefore, for enhanced understanding, FIG. 2 is described in conjunction with FIGS. 3 and 4, which are cross-sectional, side views of the semiconductor device 200 of FIG. 2 along line 3-3, according to two alternate embodiments.

According to an embodiment, and referring also to FIG. 3, device 200 is incorporated in an air cavity package, in which transistors 220 and various impedance matching elements 211, 212, 216, 232, 234, 240, and 242 are located within an enclosed air cavity 312. Basically, the air cavity is bounded by flange 206, an isolation structure 208, and a cap 310 overlying and in contact with the isolation structure 208 and leads 202, 204. In FIG. 2, an example perimeter of the cap 310 is indicated by dashed box 218. In the air cavity embodiment, the isolation structure 208 is coupled to a surface of the flange 206 and to the leads 202, 204, thereby electrically isolating the leads 202, 204 from the flange 206. More specifically, isolation structure 208 is formed from a rigid, electrically insulating material (i.e., a material with a dielectric constant in a range from about 2.0 to about 10.0, although materials with higher or lower dielectric constants may be used). Additionally, isolation structure 208 has a top surface and an opposed bottom surface coupling the flange 206 and the leads 202,204.

In an alternate embodiment, such as is illustrated in FIG. 4, the device 200 may be incorporated into an overmolded package. More specifically, transistors 220 and various impedance matching elements 211, 212, 216, 232, 234, 240, and 242 are encapsulated with a non-conductive molding compound 410, along with portions of the leads 202, 204. In the overmolded embodiment, electrical isolation between the leads 202, 204 and the flange 206 is provided by the molding compound 410, and an isolation structure (e.g., isolation structure 208) may be excluded from the device.

Transistors 220 and various elements (e.g., components integrated in IPDs 211, 242) of the input and output impedance matching circuits 210, 250 are mounted on a generally central portion of the top surface of flange 206. For example, the transistors 220 and IPDs 211, 242 may be coupled to flange 206 using conductive epoxy, solder, solder bumps, sintering, and/or eutectic bonds.

Flange 206 includes a rigid electrically-conductive substrate, which has a thickness that is sufficient to provide structural support for electrical components and elements of device 200. In addition, flange 206 may function as a heat sink for transistors 220 and other devices mounted on flange 206. Flange 206 has a top and bottom surface (only a central portion of the top surface is visible in FIG. 2), and a substantially-rectangular perimeter that corresponds to the perimeter of the device 200 (e.g., to the perimeter of isolation structure 208).

Flange 206 is formed from a conductive material, and may be used to provide a ground reference for the device 200. For example, various components and elements may have terminals and electrodes that are electrically coupled to flange 206, and flange 206 may be electrically coupled to a system ground when the device 200 is incorporated into a larger electrical system. At least the surface of flange 206 is formed from a layer of conductive material, and possibly all of flange 206 is formed from bulk conductive material. Alternatively, flange 206 may have one or more layers of non-conductive material below its top surface. Either way, flange 206 has a conductive top surface. Flange 206 may more generally be referred to as a substrate with a conductive surface.

In the example of FIG. 2, device 200 includes three transistors 220 that essentially function in parallel, although another semiconductor device may include one or two transistors or more than three transistors, as well. In addition, device 200 includes three input-side IPDs 211 that form portions of the input impedance matching circuits 210, and three output-side IPDs 242 that form portions of the output impedance matching circuits 250. Each series of an interconnected input side IPD 211, transistor 220, and output side IPD 242 corresponds to one of three amplification paths, which essentially function in parallel. It is to be understood that more or fewer of input-side IPDs 211, transistors 220, and/or output-side IPDs 242 may be implemented, as well. Moreover, all of the IPDs 211 need not be identical, and all of the IPDs 242 need not be identical. For purposes of clarity, transistors 220, input-side IPDs 211, and/or output-side IPDs 242 each may be referred to in the singular sense, below, as will analogous components in other, later-described Figures. It is to be understood that the description of a particular device component in the singular sense applies to the set of all such components. According to an embodiment, jumper wires (not illustrated) may be electrically coupled between the multiple transistors 220, input-side IPDs 211, and/or output-side IPDs 242, in order to provide low frequency paths between corresponding components.

Each transistor 220 has a control terminal (e.g., a gate) and two current conducting terminals (e.g., a drain and a source). The control terminal of each transistor 220 is coupled to the input impedance matching circuit 210 (e.g., through bondwires 216 between input-side IPD 211 and transistor 220). In addition, one current conducting terminal (e.g., the drain) is coupled to the output impedance matching circuit 250 (e.g., through bondwires 234 between transistor 220 and output-side IPD 242) and to the output lead 204 (e.g., through bondwires 232 between transistor 220 and output lead 204). The other current conducting terminal (e.g., the source) is coupled to the flange 206 (e.g., to ground), in an embodiment.

The input impedance matching circuit 210 (e.g., input impedance matching circuit 110, FIG. 1) is coupled between the input lead 202 (e.g., input lead 102, FIG. 1) and the control terminal of the transistor 220 (e.g., transistor 120, FIG. 1). Referring to FIGS. 3 and 4, the input impedance matching circuit 210 includes three inductive elements 212, 315, 216 (e.g., inductive elements 112, 115, 116, FIG. 1) and two shunt capacitors 314, 318 (e.g., capacitors 114, 118, FIG. 1). Inductive elements 212, 216 each are formed from a plurality of parallel, closely-spaced sets of bondwires, in an embodiment. For example, a first inductive element 212 (e.g., inductive element 112, FIG. 1) includes a first plurality of bondwires coupled between input lead 202 and the input-side IPD 211 (e.g., a first conductive pad on the top surface of input-side IPD 211), and a second inductive element 216 (e.g., inductive element 116, FIG. 1) includes a second plurality of bondwires coupled between the control terminal of transistor 220 and the input-side IPD 211 (e.g., a second conductive pad on the top surface of input-side IPD 211). Referring also to FIGS. 3 and 4, and as will be explained in more detail in conjunction with the description of FIGS. 5 and 6, input-side IPD 211 includes the two shunt capacitors 314, 318 (e.g., capacitors 114, 118, FIG. 1) and an integrated inductor 315 (e.g., inductor 115, FIG. 1), coupled between the shunt capacitors 314, 318.

The output impedance matching circuit 250 (e.g., output impedance matching circuit 150, FIG. 1) is coupled between a first current conducting terminal (e.g., drain) of transistor 220 (e.g., transistor 120, FIG. 1) and the output lead 204 (e.g., output lead 104, FIG. 1). The output impedance matching circuit 250 includes three inductive elements 232, 234, 240 (e.g., inductors 132, 134, 140, FIG. 1). Referring to FIGS. 3 and 4, the output impedance matching circuit 250 also includes two shunt capacitors 342, 346 (e.g., capacitors 142, 146, FIG. 1).

Again, inductive elements 232, 234, 240 each may be formed from a plurality of parallel, closely-spaced sets of bondwires, in an embodiment. For example, one inductive element 232 (e.g., inductive element 132, FIG. 1) includes a third plurality of bondwires coupled between the first current conducting terminal (e.g., the drain) of transistor 220 and the output lead 204. Referring also to FIGS. 3 and 4, another inductive element 234 (e.g., inductive element 134, FIG. 1) includes a fourth plurality of bondwires coupled between the first current conducting terminal of transistor 220 and a first electrode of a shunt capacitor 342 within output side IPD 242 (e.g., shunt capacitor 142, FIG. 1). More particularly, the fourth plurality of bondwires is coupled to a first conductive pad on the top surface of output-side IPD 242, where the first conductive pad corresponds to the RF cold point (e.g., node 135, FIG. 1). Yet another inductive element 240 (e.g., inductive element 140, FIG. 1), formed from a fifth plurality of bondwires, is coupled between the output lead 204 and a first electrode of a second shunt capacitor 346 of output-side IPD 242 (e.g., capacitor 146, FIG. 1). More particularly, the fifth plurality of bondwires is coupled to a second conductive pad on the top surface of output-side IPD 242. Second electrodes of capacitors 342, 346 are electrically connected to the flange 206 (e.g., to ground).

Figure 5:
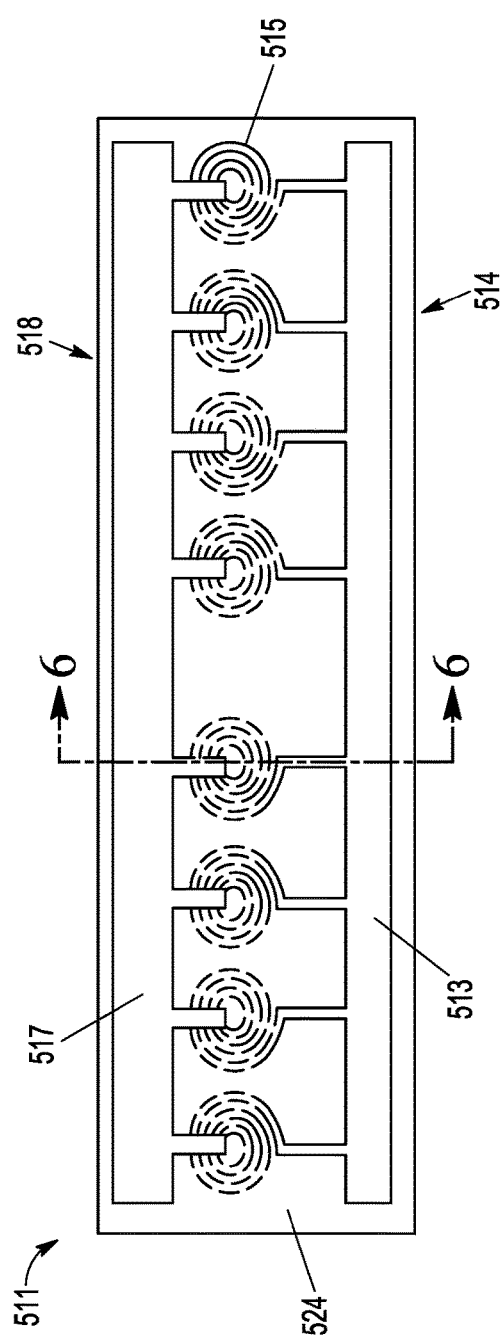
FIG. 5 is a top view of an example integrated passive device (IPD) that includes at least one component having an arrangement of TSVs, in accordance with an embodiment.

As will be explained in more detail now in conjunction with FIGS. 5 and 6, some components of the input impedance matching circuit 110, 210 are integrated within the input-side IPD 211. FIG. 5 is a top view of an IPD 511 (e.g., input-side IPD 211) that includes components of an input impedance matching circuit (e.g., components of input impedance matching circuit 110, 210, FIGS. 1, 2), in accordance with an embodiment. For enhanced understanding, FIG. 5 should be viewed in parallel with FIG. 6, which is a cross-sectional, side view of the IPD 511 of FIG. 5 along line 6-6.

According to an embodiment, IPD 511 includes components corresponding to two shunt capacitors 514, 518 (i.e., capacitors 114, 118, FIG. 1) and an inductor 515 (i.e., inductor 115, FIG. 1) of the input impedance matching circuit. More particularly, in an embodiment, shunt capacitors 514, 518, and inductor 515 are integrally formed in IPD 511. Inductor 515 is shown in dotted line in FIG. 5, as it is hidden below the top surface of IPD 511 in the top-surface view.

IPD 511 includes a semiconductor substrate 610, also referred to herein as a device substrate, with top and bottom surfaces 612, 614, also referred to herein as first and second opposing surfaces, respectively. The semiconductor substrate 610 may be formed from any of a variety of semiconductor materials, including but not limited to silicon (including silicon-on-insulator, silicon-on-sapphire, and other silicon-based composite substrates), gallium arsenide (GaAs), gallium nitride (GaN, including GaN-on-silicon, and other GaN-based composite substrates), and so on. A plurality of conductive layers 620, 621, 622 and insulating layers 626, 627, 628 are formed over the top surface 612 of the substrate 610. The insulating layers 626-628 function to selectively electrically isolate the conductive layers 620-622. IPD 511 also includes an additional conductive layer 524, also referred to herein as a conductive plane, formed on the bottom surface 614 of the substrate 610 to facilitate electrical attachment to an underlying substrate (e.g., flange 206, FIG. 2), according to an embodiment. For example, conductive layer 524 may be a gold (or other metal) layer, which facilitates forming a solder, eutectic, or conductive epoxy bond between IPD 511 and a separate conductive substrate (e.g., flange 206, FIG. 2). Alternatively, conductive layer 524 may be a metal layer which facilitates sintering (e.g., silver sintering) IPD 511 to the separate conductive substrate.

Figure 6:
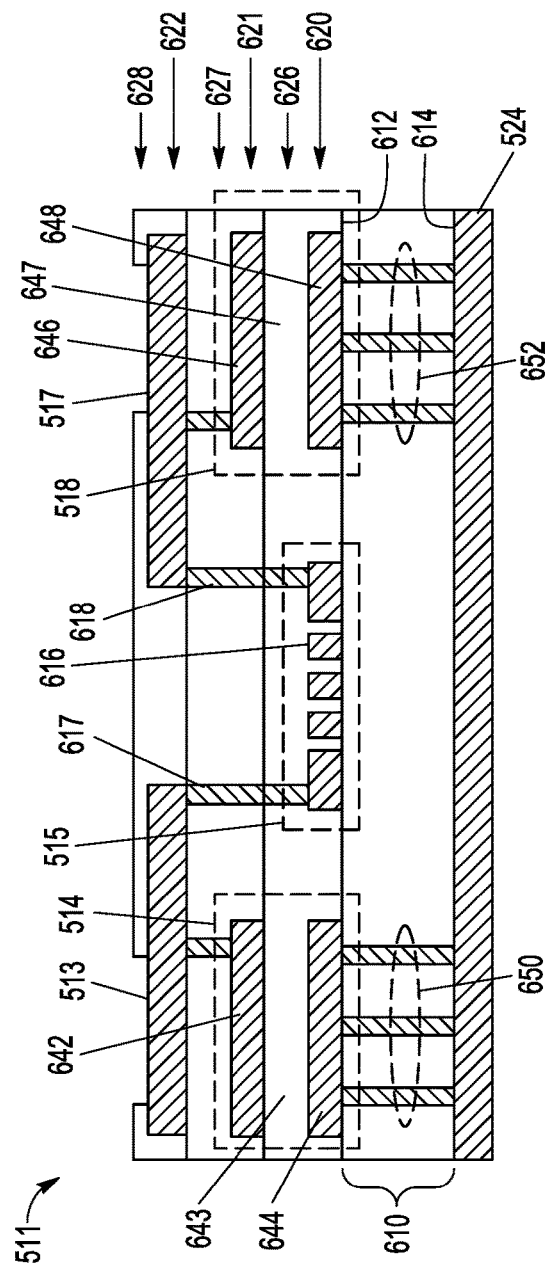
FIG. 6 is a cross-sectional, side view of the IPD of FIG. 5 along line 6-6.

Referring to FIGS. 5 and 6, and as mentioned above, IPD 511 includes a first shunt capacitor 514 (e.g., capacitor 114, FIG. 1), and a second shunt capacitor 518 (e.g., capacitor 118, FIG. 1), in an embodiment. For example, first shunt capacitor 514 may have a value in a range between about 10 pF to about 30 pF, and second shunt capacitor 518 may have a value in a range between about 60 pF to about 120 pF, although the capacitance values may be lower or higher, in other embodiments. Further, inductor 515 may have a value in a range between about 100 pH to about 400 pH, although the inductance value may be lower or higher, in other embodiments.

According to an embodiment, first capacitor 514 and second capacitor 518 each is implemented as metal-insulator-metal (MIM) capacitors (e.g., with parallel metal plates, also referred to herein as component electrodes, electrically separated by a thin dielectric (e.g., a thin nitride or oxide)), which are depicted in simplified form in FIG. 6. In an actual implementation, the portions of each MIM capacitor may be formed using different and/or more complicated metal and dielectric structures, from which the component electrodes and dielectric can be formed, and or one or more layers of additional materials such as one or more glass layers. In any event, in the embodiment shown, first capacitor 514 includes a top capacitor electrode 642 formed from a portion of conductive layer 621, a bottom capacitor electrode 644 formed from a portion of conductive layer 620 and vertically aligned with the top capacitor electrode 642, and dielectric material 643 formed from a portion of insulating layer 626. Similarly, second capacitor 518 includes a top capacitor electrode 646 formed from a portion of conductive layer 621, a bottom capacitor electrode 648 formed from a portion of conductive layer 620 and vertically aligned with the top capacitor electrode 646, and dielectric material 647 formed from a portion of insulating layer 626.

According to an embodiment, IPD 511 also includes first and second sets of conductive through substrate vias (TSVs) 650, 652 extending between the top and bottom surfaces 612, 614 of substrate 610. For an embodiment, the TSVs are formed from tungsten or tungsten alloy. A first end of each TSV 650 in the first set of TSVs 650 is electrically coupled to the bottom capacitor electrode 644 of first shunt capacitor 514, and a first end of each TSV 652 in the second set of TSVs 652 is electrically coupled to the bottom capacitor electrode 648 of second shunt capacitor 518. In addition, second ends of each TSV 650, 652 in both the first and second sets of TSVs 650, 652 are electrically coupled to the conductive layer 524 (e.g., a conductive ground plane) on the bottom surface 614 of the substrate 610. In an alternate embodiment, conductive pads or balls may be coupled to the ends of the TSVs 650, 652 that are coplanar with the bottom surface 614 of the substrate 610, rather than being electrically coupled to conductive layer 524. In this alternate embodiment, the pads or balls can be considered the "conductive plane" coupled laterally to and coplanar with the bottom surface 614 of the substrate 610.

In an embodiment, inductor 515 is implemented as a conductive coil 616, which has a first end electrically coupled to the top capacitor electrode 642 of the first shunt capacitor 514, and a second end electrically coupled to the top capacitor electrode 646 of the second shunt capacitor 518. For example, in an embodiment, the coil 616 corresponding to inductor 515 may be formed from a portion of a single conductive layer, such as conductive layer 620, and the first and second ends of the coil 616 could be coupled to the top capacitor electrodes 642, 646 through conductive vias 617, 618, respectively, along with other conductive interconnect structures. Alternatively, the coil 616 corresponding to inductor 515 may be formed from multiple conductive layers that are interconnected with conductive vias.

To facilitate interconnection of first shunt capacitor 514 and second shunt capacitor 518 to external circuitry (e.g., to transistor 120, 220 and/or input lead 102, 202, FIGS. 1, 2), IPD 511 also includes contact pads 513, 517 exposed at its top surface. According to an embodiment, each contact pad 513, 517 is configured to accept attachment of one or more bondwires (e.g., bondwires 212, 216). The contact pads 513, 517 may be formed from the same or different conductive layers than top electrodes 642, 646. When IPD 511 is incorporated into an RF amplifier device such as RF amplifier device 100, contact pad 513 corresponds to node 113 of FIG. 1, and contact pad 517 corresponds to node 117 of FIG. 1.

Although the electrodes 642, 644, 646, 648 of the first and second shunt capacitors 514, 518 are illustrated as being formed from portions of the same conductive layers (i.e., layers 620, 621), the electrodes 642, 644, 646, 648 of capacitors 514, 518 may be formed from portions of different layers from each other and/or from different layers than those depicted in FIG. 6. For example, one or more other conductive layers, not illustrated, may be present below or above the conductive layers 620, 621 from which capacitors 514, 518 are formed. In addition, although each of capacitors 514, 518 are illustrated as simple parallel plate capacitors consisting of a single top electrode and a single bottom electrode, either or both of capacitors 514, 518 could have other types of capacitor structures as well. For example, the electrodes could consist of multiple, interleaved conductive structures, and so on.

In the embodiment depicted in FIGS. 5 and 6, shunt capacitors 514, 518, and inductor 515 are integrally formed in IPD 511, which can be implemented as an integrated circuit device in accordance with the present teachings. Namely, the IPD 511 can include: a device substrate, e.g., 610, having first and second opposing surfaces, e.g., 612, 614; a first component electrode, e.g., 644, 648, coupled to the first surface 612; a conductive plane, e.g., 524, coupled to the second opposing surface 614; and a plurality of through substrate vias, e.g., 650, 652, electrically coupling a first region of the first component electrode to the conductive plane through the device substrate, wherein a second adjacent region of the first component electrode is substantially devoid of through substrate vias. Arrangement of the plurality of through substrate vias in the first region is based on a projected current distribution through the first component electrode when the integrated circuit device is operational.

For example, the first set of TSVs 650 can be arranged, in accordance with an embodiment, when the projected or expected current through the bottom capacitor electrode 644 of the first capacitor 514 is non-uniform. More particularly, the first set of TSVs 650 can have a non-uniform arrangement, contrary to the prior art uniform arrangement of TSVs shown in FIG. 10. Namely, the TSVs 650 can be arranged such that all the TSVs in the first set 650 are electrically coupled between a first region of the bottom capacitor electrode 644 and the conductive plane 524; and a second adjacent region of the bottom capacitor electrode 644 is, thereby, substantially devoid of TSVs. The arrangement or distribution of the plurality of TSVs 650 in the first region of the bottom capacitor electrode 644 is based on, e.g., correlates with, a projected current distribution through the bottom capacitor electrode 644 when the integrated circuit device, e.g., 200, is operational.

Similarly, the second set of TSVs 652 can be arranged, in accordance with an embodiment, when the projected or expected current through the bottom capacitor electrode 648 of the second capacitor 518 is non-uniform. More particularly, the second set of TSVs 652 can have a non-uniform arrangement, contrary to the prior art uniform arrangement of TSVs shown in FIG. 10. Namely, the TSVs 652 can be arranged such that all the TSVs in the second set 652 are electrically coupled between a first region of the bottom capacitor electrode 648 and the conductive plane 524; and a second adjacent region of the bottom capacitor electrode 648 is, thereby, substantially devoid of TSVs. The arrangement or distribution of the plurality of TSVs 652 in the first region of the bottom capacitor electrode 648 is based on, e.g., correlates with, a projected current distribution through the bottom capacitor electrode 648 when the integrated circuit device, e.g., 200, is operational. Details of example arrangements of TSVs, in accordance with multiple embodiments, are provided later by reference to FIGS. 11 through 18.

Additionally, the RF amplifier device 200 can be implemented as an integrated circuit device in accordance with the present teachings. Namely, the RF amplifier device 200 includes: a transistor 220, having a control terminal, a first current conducting terminal, and a second current conducting terminal; an input impedance matching circuit, e.g., 210, coupled to the control terminal of the transistor 220; and an output impedance matching circuit, e.g., 250 coupled to the first current conducting terminal of the transistor 220. One or both of the input and output impedance matching circuits 210, 250 can include a device substrate having first and second opposing surfaces; a component electrode coupled to the first surface; a conductive plane coupled to the second surface; and a plurality of TSVs electrically coupling a first region of the first component electrode to the conductive plane through the device substrate. A second adjacent region of the first component electrode is substantially devoid of TSVs, and arrangement of the plurality of TSVs in the first region is based on a projected current distribution through the first component electrode when the integrated circuit device 200 is operational.

In the embodiments depicted in FIGS. 2 to 6, the input and/or output impedance matching circuit, e.g., 210, 250, can include an integrated passive device, e.g., IPD 211, 242, having integrated therein or included thereon one or more components, such as the shunt capacitors 314, 318, 342, 356, coupled to a plurality of TSVs having an arrangement according to the present teachings. As earlier mentioned, the IPDs 211, 242 are distinct or separate from a die on which the transistor 220 is included or integrated. In an alternate embodiment, one or both of the input and output impedance matching circuits can be integrated on the same die as the transistor.

Figure 7:
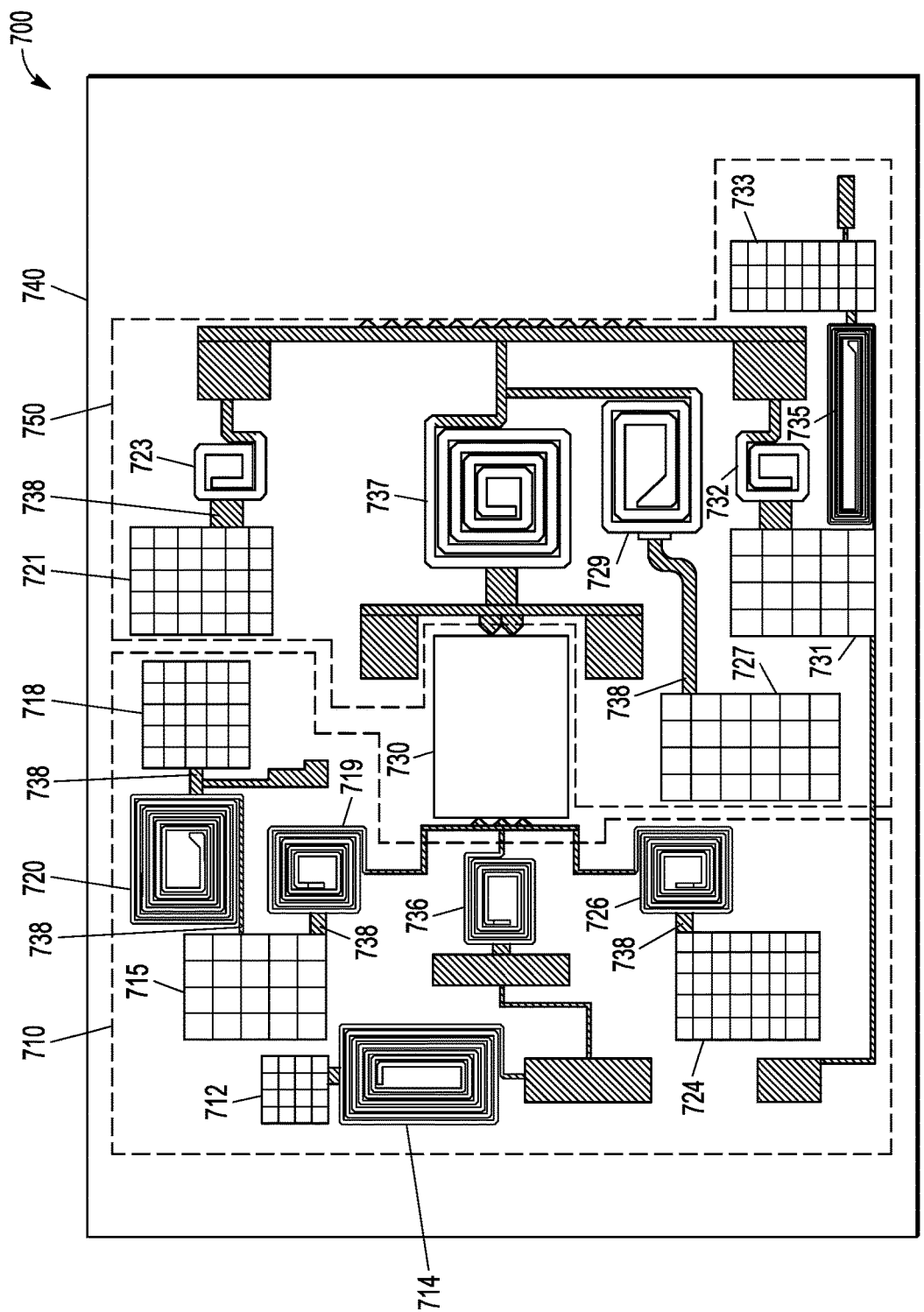
FIG. 7 is a top view of an example monolithic integrated circuit device or portion thereof that can have an arrangement of TSVs coupled to one or more components, in accordance with an embodiment.

FIG. 7 is a top view of an example monolithic integrated circuit device 700, or portion thereof, which contains a transistor 730, an input impedance matching circuit 710, and an output impedance matching circuit 750 all integrated within a single "die," or piece of semiconductor substrate, 740. Moreover, the device 700 can include at least one component coupled to an arrangement of TSVs, in accordance with an embodiment. For the embodiment depicted in FIG. 7, the transistor 730 and input and output impedance circuits 710, 750, respectively, are formed on, and thereby share, the same device substrate 740, which has first, e.g., upper or top, and second, e.g., underside or bottom, opposing surfaces. The device substrate 740 can be formed from any of a variety of semiconductor materials, including but not limited to silicon (including silicon-on-insulator, silicon-on-sapphire, and other silicon-based composite substrates), gallium arsenide (GaAs), gallium nitride (GaN, including GaN-on-silicon, and other GaN-based composite substrates), and so on.

The top surface of substrate 740 is shown in FIG. 7, onto or over which at least some portions of the transistor 730, components of the input and output impedance circuits 710, 750, and some metal interconnects are formed from one or more conductive and insulating layers. The metal interconnects are shown as being shaded with diagonal lines. As an example, the metal interconnects can be formed from one or multiple conductive layers and can include: metal lines, also referred to as transmission lines, for sending signals between components, power, and ground; metal via plugs for connecting two metal layers on different planes; and/or pads for the input or output of signals such as RF signals.

Also, although not shown, the transistor 730 and at least some of the components included within the input and output circuits 710, 750 are electrically coupled to a common conductive plane, which is coupled to or formed on the bottom surface of the substrate 740. As an example, the conductive plane has a substantially-rectangular perimeter that corresponds to the perimeter of the substrate 740, and the conductive plane can be used to provide a ground or another voltage reference for the integrated circuit device 700. Moreover, the conductive plane can have at least a conductive surface with one or more layers of non-conductive material below its surface or can alternately be formed from bulk conductive material. For a further embodiment, the conductive plane is coupled to a system ground when the device 700 is incorporated into a larger electrical system. It should be noted that the device 700 depicted in FIG. 7 is not meant to be limiting but merely an example, and additional or fewer components and/or additional types of components can be included in the device 700 with any suitable interconnectivity needed for a given application.

Transistor 730 is the primary active component of device 700 and includes a control terminal, e.g., a gate, and two current conducting terminals, e.g., source and drain. For an embodiment, the control terminal is electrically coupled to the input impedance matching circuit 710, for instance through metal interconnects formed from copper, aluminum, or an alloy thereof. A first current conducting terminal, e.g., the drain, is electrically coupled to the output impedance matching circuit 750, for instance through metal interconnects formed from copper, aluminum, or an alloy thereof. The second current conducting terminal, e.g., the source, is electrically coupled to ground or another voltage reference, such as by being coupled to a conductive plane of the device 700.

In the embodiments depicted in FIGS. 2 to 6, the transistors 220 are coupled to the input and output impedance matching circuits 210, 250 using a set of bondwires connected to conductive pads on the top surface of the transistors 220 and conductive pads on top surfaces of components of the input and output impedance matching circuits 210, 250. Moreover, the input impedance matching circuit 210 is coupled to the input lead 202 using a set of bondwires. Likewise, the output impedance matching circuit 250 is coupled to the output lead 204 using a set of bondwires. These sets of bondwires of the integrated circuit device 200 can, thereby, serve as a current feed mechanism configured to "top feed" a current into and/or out of the transistors 220 and into and out of components of the input and output impedance matching circuits 210, 250 by being coupled relative to the top of a component electrode of a component, also referred to as a component terminal in the case of a transistor.

By contrast, in the device 700, the transistor 730 is electrically coupled to the input and output impedance matching circuits 710, 750, using metal interconnects formed from one or more conductive layers deposited or otherwise formed on the die 740. Similarly, components within the input impedance matching circuit 710 and components within the output impedance matching circuit 750 are electrically coupled together using metal interconnects formed from one or more conductive layers deposited or otherwise formed on the die 740. For an embodiment, the metal interconnects provide lateral or side connections between components instead of the top surface connections of the embodiments depicted in FIGS. 2 to 6. Accordingly, the metal interconnects of the integrated circuit device 700 can serve as a current feed mechanism to "side feed" a current into and/or out of the transistor 730 and into and/or out of components of the input and output impedance matching circuits 710, 750 by being coupled relative to the side of a component electrode or terminal. A "feed," as the term is later used herein, is an end portion of a metal interconnect or of another component that directly connects to a given component in order to transfer, e.g., provide and/or receive, a signal to and/or from the component to which the feed is connected. Examples of feeds are indicated at 738 in FIG. 7.

The input impedance matching circuit 710 can be coupled between a signal source, for example an RF signal source generated internal or external to the device 700, and a control terminal, e.g., the gate, of the transistor 730. As illustrated, the input impedance matching circuit 710 includes multiple capacitors, e.g., 712, 715, 718, and 724, and multiple inductors, e.g., 714, 719, 720, 726, and 736, which are electrically coupled to each other and to the transistor 730 using metal interconnects. For example, a capacitor 712 has a top capacitor (component) electrode, shown, which is connected to a first end of an inductor 714. A second end of inductor 714 is coupled to a first end of an inductor 736. A second end of inductor 736 is connected to the control terminal of transistor 730. A capacitor 715 has a top capacitor electrode, shown, which is connected to first ends of inductors 719 and 720. A second end of inductor 719 is connected to the control terminal of transistor 730. A second end of inductor 720 is connected to a top capacitor electrode, shown, of a capacitor 718. A capacitor 724 has a top capacitor electrode, shown, which is connected to a first end of an inductor 726. A second end of inductor 726 is connected to the control terminal of transistor 730. For an embodiment, bottom electrodes (not shown) of capacitors 712, 715, 718, and 724 are electrically coupled to ground, for instance by a connection through the substrate 740 to a conductive plane (not shown) of the device 700 using respective sets of TSVs that are arranged in accordance with the present teachings.

The output impedance matching circuit 750 can be coupled between a current conducting terminal, e.g., the drain, of the transistor 730 and an external or internal circuit or component not shown, such as an internal second stage transistor formed on the die 740 or a load external to the die 740. As illustrated, the output impedance matching circuit 750 includes multiple capacitors, e.g., 721, 727, 731, and 733, and multiple inductors, e.g., 723, 729, 732, 735, and 737, which are electrically coupled to each other and to the transistor 730 using metal interconnects. For example, a capacitor 721 has a top capacitor electrode, shown, which is connected to a first end of an inductor 723. A second end of inductor 723 is coupled to first ends of inductors 729, 732, and 737. A second end of inductor 737 is connected to the drain of transistor 730. A second end of inductor 729 is connected to a top capacitor electrode, shown, of a capacitor 727. A second end of inductor 732 is connected to a top capacitor electrode, shown, of a capacitor 731. The top capacitor electrode of capacitor 731 is also connected to a first end of an inductor 735. A second end of inductor 735 is connected to a top capacitor electrode, shown, of a capacitor 733. For an embodiment, bottom electrodes (not shown) of capacitors 721, 727, 731, and 733 are electrically coupled to ground, for instance by a connection through the substrate 740 to a conductive plane (not shown) of the device 700 using respective sets of TSVs that are arranged in accordance with the present teachings.

For a particular embodiment, inductors 714, 719, 720, 726, 736, 723, 729, 732, 735, and 737 of the input and output impedance matching circuits 710, 750 are implemented as conductive coils formed from portions of one or more conductive layers formed over the substrate 740. For a particular embodiment, capacitors 712, 715, 718, 724, 721, 727, 731, and 733 of the input and output impedance matching circuits 710, 750 are implemented as MIM capacitors having parallel and vertically aligned top and bottom electrodes (also referred to as plates) separated by a dielectric, which are formed from portions of two or more conductive layers and one or more intervening non-conductive or insulating layers formed over the substrate 740.

Figure 8:
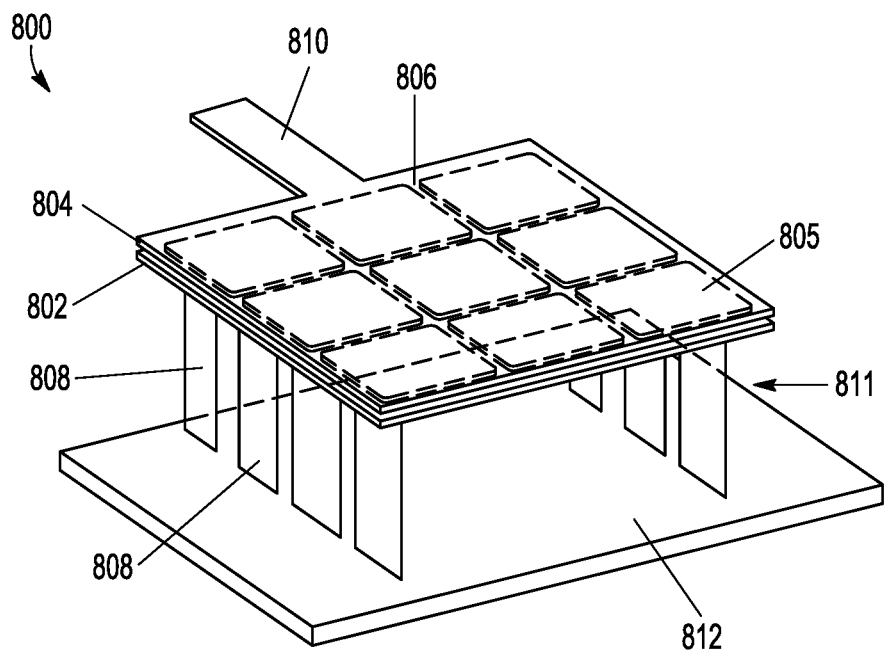
FIG. 8 is an orthogonal view of an example integrated circuit device or portion thereof having a shunt capacitor and an arrangement of TSVs, in accordance with an embodiment.

FIG. 8 is an orthogonal view illustrating an example integrated circuit device 800, or portion thereof, having a shunt capacitor and an arrangement of TSVs, in accordance with an embodiment. For one example, the device depicted as 800 is a portion of the input or output impedance matching circuit 710, 750 of the device 700, which contains a MIM capacitor. Alternately, device 800 is implemented as a stand-alone device having a single MIM capacitor component includable within a larger system such as being mounted on a printed circuit board (PCB).

The device 800, accordingly, includes a device substrate 811 (e.g., substrate 740, FIG. 7) having first and second opposing surfaces, a conductive plane 812 coupled to the second surface, and a first component electrode 802 coupled to the first surface. The device 800 also includes a plurality of non-uniformly spaced TSVs 808 coupling a first region of the first component electrode 802 to the conductive plane 812 through the device substrate 811, wherein a second adjacent region of the first component electrode 802 is substantially devoid of TSVs 808. As can be seen, the first component electrode 802 and the conductive plane 812 are positioned parallel to each other, and the plurality of TSVs 808 are positioned orthogonal to the first component electrode 802 and the conductive plane 812 with first ends of the plurality of TSVs 808 connected to the first component electrode 802 in the first region and second ends of the plurality of TSVs 808 connected to the conductive plane 812.

Since device 800 includes a capacitor component, the device 800 further includes a second component electrode 806 and a dielectric component 804 coupled between the first and second component electrodes 802, 806. The first and second component electrodes 802, 806 are depicted in simplified form as parallel plates each formed from portions of single conductive layers formed above the substrate 811. Alternately, either or both component electrodes 802, 806 can be formed from portions of multiple conductive layers. The dielectric component 804 includes multiple substantially-equally spaced blocks 805 of insulating material that can be formed from portions of a single or multiple insulating layers formed over the substrate 811. However, in an alternate embodiment, the dielectric component 804 is a single contiguous block of insulating material having one or more insulating layers. In another alternate embodiment, the first and second component electrodes 802, 806 each include multiple substantially-equally spaced blocks that are substantially the same size as the block 805, whereby the MIM capacitor includes, for instance, multiple smaller interleaved MIM structures.

The device 800 further includes a feed mechanism 810, also referred to herein as simply a feed, connected parallel to (and contacting) and aligned with a perimeter segment, in this case one of four edges, of the second component electrode 806. The feed 810 is further coupled parallel to (but not contacting) and aligned with a corresponding perimeter segment or edge of the first component electrode 802. Thus, feed 810 is a side feed mechanism that can be configured, e.g., by being coupled to a current source from another part of the circuit 700, to provide current to the second component electrode 806 and to, thereby, provide current to the first component electrode 802 when the integrated circuit device 800 is operational.

Figure 9:
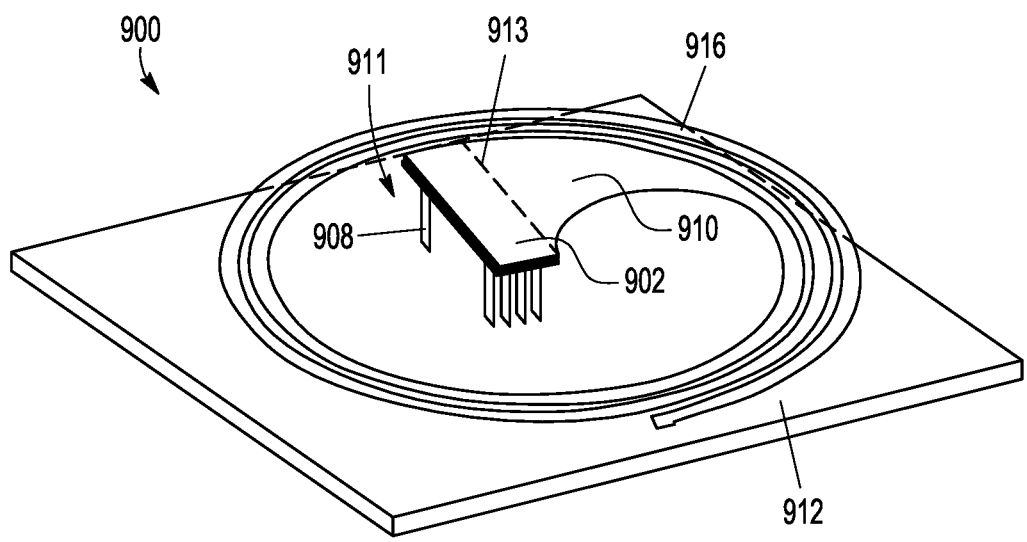
FIG. 9 is an orthogonal view of an example integrated circuit device or portion thereof having a shunt inductor and an arrangement of TSVs, in accordance with an embodiment.

FIG. 9 is an orthogonal view illustrating an example integrated circuit device 900, or portion thereof, having a shunt inductor and an arrangement of TSVs, in accordance with an embodiment. For one example, the device depicted as 900 is a portion of an input or output impedance matching circuit or some other part of a larger circuit. Alternately, device 900 is implemented as a stand-alone device having a single inductor component includable within a larger system such as being mounted on a PCB.

The device 900, accordingly, includes a device substrate 911 having first and second opposing surfaces, a conductive plane 912 coupled to the second surface, and a component electrode 902 coupled to the first surface. The device 900 also includes a plurality of non-uniformly spaced TSVs 908 coupling a first region of the component electrode 902 to the conductive plane 912 through the device substrate 911, wherein a second adjacent region of the component electrode is substantially devoid of through substrate vias. As can be seen, the component electrode 902 and the conductive plane 912 are positioned parallel to each other, and the plurality of TSVs 908 are positioned orthogonal to the component electrode 902 and the conductive plane 912 with first ends of the plurality of TSVs 908 connected to the component electrode 902 in the first region and second ends of the plurality of TSVs 908 connected to the conductive plane 912.

Since device 900 includes an inductor component, the device 900 further includes a coil 916. The device 900 also includes a current feed mechanism 910, also referred to herein simply as a feed, wherein the feed 910 and the coil 916 are coupled to the component electrode 902. Namely, the feed 910 is an end of the coil 916, which connects to the component electrode 902. Even more particularly, the feed 910 is parallel to and aligned with a perimeter segment 913, in this case an edge, of the component electrode 902. Thus, feed 910 is a side feed mechanism that can be configured, e.g., by being coupled through the coil 916 to a current source on another part of a circuit or system, to provide current to the component electrode 902. The component electrode 902 is depicted as being formed from a single conductive layer formed above the substrate 911. Alternately, the component electrode 902 is formed from multiple conductive layers.

FIG. 10 is a top view of a portion of an integrated circuit device 1000 having a component and a prior art arrangement of TSVs. Illustrated, as being included within the device 1000, is a component electrode 1002, e.g., of a shunt capacitor or shunt inductor, and a plurality of TSVs 1008 coupled to the component electrode 1002. Since the TSVs 1008 are coupled to an underside of the component electrode 1002, the TSVs are shown in dashed lines. The component electrode 1002 has a shape of a parallelogram (in this case a square) having four perimeter segments (in this case four edges). As shown, each TSV 1008 has an elongated cross-section with a first dimension that is longer than a second dimension. Of note is the uniform arrangement and density of the TSVs 1008, wherein the TSVs 1008 form four equidistant columns and 14 equidistant rows. This uniform arrangement maximizes the number of TSVs, for instance while maintaining a density upper limit, as is known in the art.

FIGS. 11 to 18 also illustrate a top view of a portion of an integrated circuit device having a component and an arrangement of TSVs. Similar to what is shown in FIG. 10, illustrated as being included within the respective integrated circuit devices, is a component electrode, e.g., of a shunt capacitor, and a plurality of TSVs coupled to the component electrode. Since the TSVs are coupled to an underside of the component electrode, the TSVs are shown in dashed lines. The component electrode has a shape of a parallelogram (in this case a square) having four perimeter segments (in this case four edges). As shown, each TSV has an elongated cross-section with a first dimension that is longer than a second dimension.

However, in contrast to the prior art uniform arrangement and density of TSVs 1008 shown in FIG. 10, FIGS. 11 to 18 illustrate examples of non-uniform arrangements and densities of TSVs in accordance with various embodiments of the present teachings. Namely, for each embodiment, all or a significantly higher density per unit area of the TSVs are coupled to a first region of the component electrode, while a second adjacent region of the component electrode is substantially devoid of TSVs being coupled thereto. As used herein, a "region" of a component electrode is a continuous portion of the planar conductive material forming the component electrode. The density, arrangement or placement of the TSVs relative to the component electrode is based on, and for example correlates with, a projected current distribution through the component electrode when the integrated circuit device is operational.

Moreover, each of FIGS. 11 to 18 further illustrates a feed coupled relative to the component electrode. However, the feed is shown in dashed lines as it may be coupled directly to, i.e., connected to, another component electrode in a different plane than the component electrode to which the TSVs are connected, as in the case of a shunt capacitor for which the feed is connected to one capacitor electrode (or plate) and the TSVs are connected to another capacitor electrode (or plate). Notwithstanding, the teachings herein apply to other component types, such as inductors, e.g., the inductor of FIG. 9, where the feed is connected to the component electrode to which the TSVs are also connected. Additionally, the teachings herein apply to alternate embodiments that include a component electrode of a different shape to which the TSVs are connected, including shapes where at least part of the perimeter of the component electrode is rounded or curved. The teachings herein also apply to alternate embodiments that include TSVs having a different cross-sectional shape (e.g., round, oval, rectangular, and so on). The teachings herein further apply to alternate embodiments with different feed mechanisms, which can have different couplings relative to the component electrode (such as the top feed mechanism illustrated in the embodiments shown in FIGS. 2 to 6), different feed sizes and shapes (such as feeds shown in FIG. 7), different numbers of feeds (including multiple feeds attached to the same perimeter segment or edge of a component electrode), etc.

Figure 11:
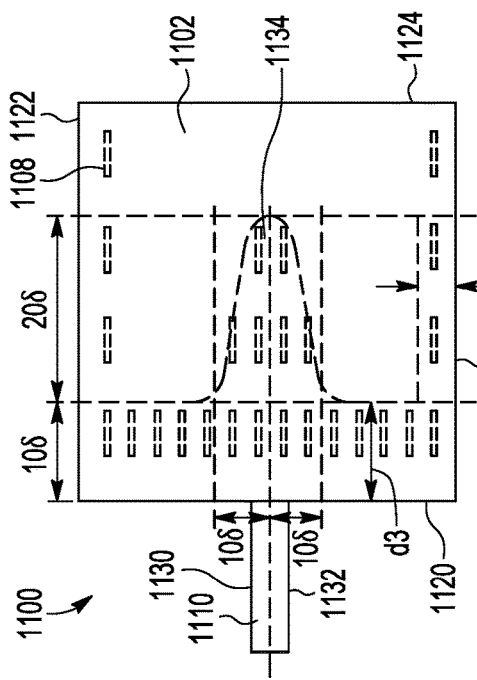
FIG. 11 is a top view of a portion of an integrated circuit device having a component and an example arrangement of TSVs, in accordance with an embodiment.

FIG. 11 is a top view of a portion of an integrated circuit device 1100 having a component and an example arrangement of TSVs, in accordance with an embodiment. Illustrated, as included within the device 1100, is a first planar electrode 1102 (e.g., a bottom capacitor electrode) having edges 1120, 1122, 1124, and 1126, a feed 1110 coupled relative to the first electrode 1102, and a plurality of TSVs 1108 connected to an underside of the first electrode 1102. The feed 1110 has a shape of a rectangle with a first perimeter segment (in this case edge) that may be connected at a center of an edge of a second planar electrode (e.g., a top capacitor electrode (not shown)), which is parallel to and aligned with the edge 1120 of the first electrode 1102. The feed 1110 also has second and third edges 1130, 1132, orthogonal to the first edge of the feed 1110 and orthogonal to the edge 1120, and a fourth edge orthogonal to the second and third edges 1130, 1132 and distal from the first edge of the feed 1110. A distance between the second and third edges 1130, 1132 defines a width of the feed 1110 relative to a length of the edge 1120 of the first electrode 1102. The width of the feed in this embodiment is about one eighth the length of the edge 1120, although the feed width may be smaller or larger with respect to the edge length.

Figure 12:
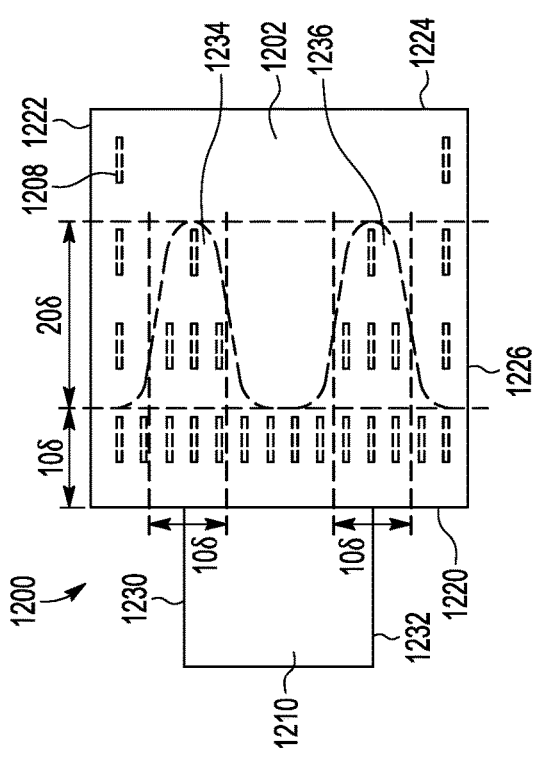
FIG. 12 is a top view of a portion of an integrated circuit device having a component and an example arrangement of TSVs, in accordance with an alternate embodiment.

FIG. 12 is a top view of a portion of an integrated circuit device 1200 having a component and an example arrangement of TSVs, in accordance with an embodiment. Illustrated, as included within the device 1200, is a first planar electrode 1202 (e.g., a bottom capacitor electrode) having edges 1220, 1222, 1224, and 1226, a feed 1210 coupled relative to the first electrode 1202, and a plurality of TSVs 1208 connected to an underside of the first electrode 1202. The feed 1210 has a shape of a rectangle with a first perimeter segment (in this case edge) that is connected at a center of an edge of a second planar electrode (e.g., a top capacitor electrode (not shown)), which is parallel to and aligned with the edge 1220 of the first electrode 1202. The feed 1210 also has second and third edges 1230, 1232, orthogonal to the first edge of the feed 1210 and orthogonal to the edge 1220, and a fourth edge orthogonal to the second and third edges 1230, 1232 and distal from the first edge of the feed 1210. A distance between the second and third edges 1230, 1232 defines a width of the feed 1210 relative to the edge 1220 of the first electrode 1202. The width of the feed in this embodiment is about half the length of the edge 1220, although the feed width may be smaller or larger with respect to the edge length.

Figure 13:
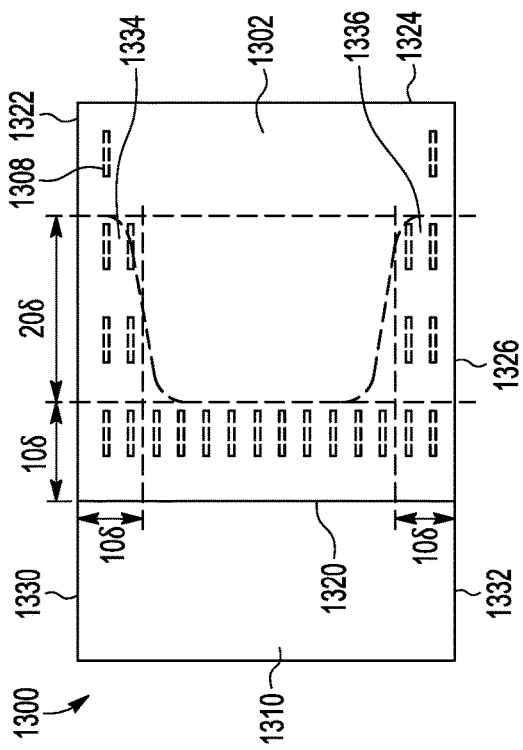
FIG. 13 is a top view of a portion of an integrated circuit device having a component and an example arrangement of TSVs, in accordance with an alternate embodiment.

FIG. 13 is a top view of a portion of an integrated circuit device 1300 having a component and an example arrangement of TSVs, in accordance with an embodiment. Illustrated, as included within the device 1300, is a first planar electrode 1302 (e.g., a bottom capacitor electrode) having edges 1320, 1322, 1324, and 1326, a feed 1310 coupled relative to the first electrode 1302, and a plurality of TSVs 1308 connected to an underside of the first electrode 1302. The feed 1310 has a shape of a rectangle with a first perimeter segment (in this case edge) that is connected at an edge of a second planar electrode (e.g., a top capacitor electrode (not shown)), which is parallel to and aligned with the edge 1320 of the first electrode 1302. The feed 1310 also has second and third edges 1330, 1332, orthogonal to the first edge of the feed 1310 and orthogonal to the edge 1320, and a fourth edge orthogonal to the second and third edges 1330, 1132 and distal from the first edge of the feed 1310. A distance between the second and third edges 1330, 1332 defines a width of the feed 1310 relative to the edge 1320 of the first electrode 1302. The width of the feed in this embodiment is about the same as the length of the edge 1320.

FIG. 14 is a top view of a portion of an integrated circuit device 1400 having a component and an example arrangement of TSVs, in accordance with an embodiment. Illustrated, as included within the device 1400, is a first planar electrode 1402 (e.g., a bottom capacitor electrode) having edges 1420, 1422, 1424, and 1426, a feed 1410 coupled relative to the first electrode 1402, and a plurality of TSVs 1408 connected to an underside of the first electrode 1402. The feed 1410 has a shape of a rectangle with a first perimeter segment (in this case edge) that is connected at a center of an edge of a second planar electrode (e.g., a top capacitor electrode (not shown)), which is parallel to and aligned with the edge 1420 of the first electrode 1402. The feed 1410 also has second and third edges orthogonal to the first edge of the feed 1410 and orthogonal to the edge 1420, and a fourth edge orthogonal to the second and third edges and distal from the first edge of the feed 1410. A distance between the second and third edges defines a width of the feed 1410 relative to the edge 1420 of the first electrode 1402. The width of the feed in this embodiment is about one eighth the length of the edge 1420, although the feed width may be smaller or larger with respect to the edge length.

FIG. 15 is a top view of a portion of an integrated circuit device 1500 having a component and an example arrangement of TSVs, in accordance with an embodiment. Illustrated, as included within the device 1500, is a first planar electrode 1502 (e.g., a bottom capacitor electrode) having edges 1520, 1522, 1524, and 1526, a feed 1510 coupled relative to the first electrode 1502, and a plurality of TSVs 1508 connected to an underside of the first electrode 1502. The feed 1510 has a shape of a rectangle with a first perimeter segment (in this case edge) that is connected at a center of an edge of a second planar electrode (e.g., a top capacitor electrode (not shown)), which is parallel to and aligned with the edge 1520 of the bottom capacitor electrode 1502. The feed 1510 also has second and third edges orthogonal to the first edge of the feed 1510 and orthogonal to the edge 1520, and a fourth edge orthogonal to the second and third edges and distal from the first edge of the feed 1510. A distance between the second and third edges defines a width of the feed 1510 relative to the edge 1520 of the first electrode 1502. The width of the feed in this embodiment is about half the length of the edge 1520, although the feed width may be smaller or larger with respect to the edge length.

FIG. 16 is a top view of a portion of an integrated circuit device 1600 having a component and an example arrangement of TSVs, in accordance with an embodiment. Illustrated, as included within the device 1600, is a first planar electrode 1602 (e.g., a bottom capacitor electrode) having edges 1620, 1622, 1624, and 1626, a feed 1610 coupled relative to the bottom capacitor electrode 1602, and a plurality of TSVs 1608 connected to an underside of the first electrode 1602. The feed 1610 has a shape of a rectangle with a first perimeter segment (in this case edge) that is connected at an edge of a second planar electrode (e.g., a top capacitor electrode (not shown)), which is parallel to and aligned with the edge 1620 of the first electrode 1602. The feed 1610 also has second and third edges orthogonal to the first edge of the feed 1610 and orthogonal to the edge 1620, and a fourth edge orthogonal to the second and third edges and distal from the first edge of the feed 1610. A distance between the second and third edges defines a width of the feed 1610 relative to the edge 1620 of the first electrode 1602. The width of the feed in this embodiment is about the same as the length of the edge 1620.

Figure 17:
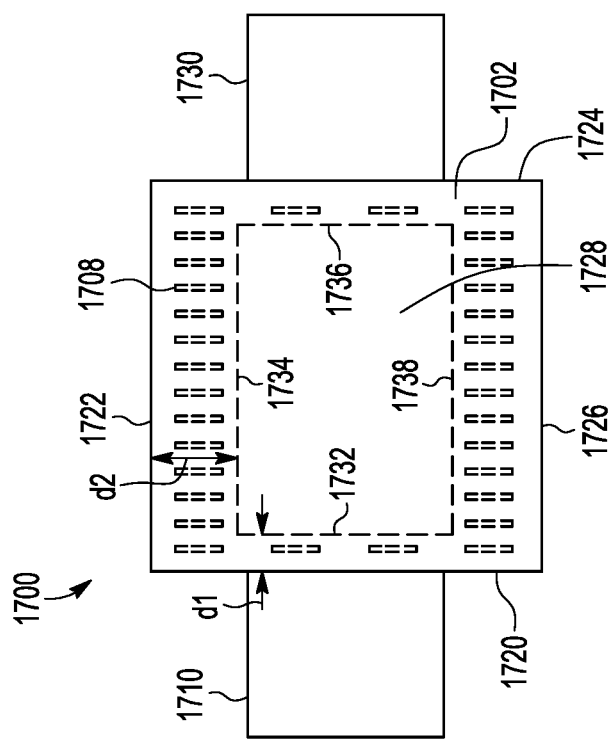
FIG. 17 is a top view of a portion of an integrated circuit device having a component and an example arrangement of TSVs, in accordance with an alternate embodiment.

FIG. 17 is a top view of a portion of an integrated circuit device 1700 having a component and an example arrangement of TSVs, in accordance with an embodiment. Illustrated, as included within the device 1700, is a first planar electrode 1702 (e.g., a bottom capacitor electrode) having edges 1720, 1722, 1724, and 1726, feeds 1710, 1730 coupled relative to the first electrode 1702, and a plurality of TSVs 1708 connected to an underside of the first electrode 1702. The feed 1710 has a shape of a rectangle with a first perimeter segment (in this case edge) that is connected at a center of an edge of a second planar electrode (e.g., a top capacitor electrode (not shown)), which is parallel to and aligned with the edge 1720 of the first electrode 1702. The feed 1710 also has second and third edges orthogonal to the first edge of the feed 1710 and orthogonal to the edge 1720, and a fourth edge orthogonal to the second and third edges and distal from the first edge of the feed 1710. A distance between the second and third edges defines a width of the feed 1710 relative to the edge 1720 of the first electrode 1702. The width of the feed in this embodiment is about half the length of the edge 1720, although the feed width may be smaller or larger with respect to the edge length. The feed 1730 has substantially the same shape and size as the feed 1710 and is connected opposite the feed 1710 at the center of an edge of the second electrode, which is parallel to and aligned with the edge 1724 of the first electrode 1702.

Figure 18:
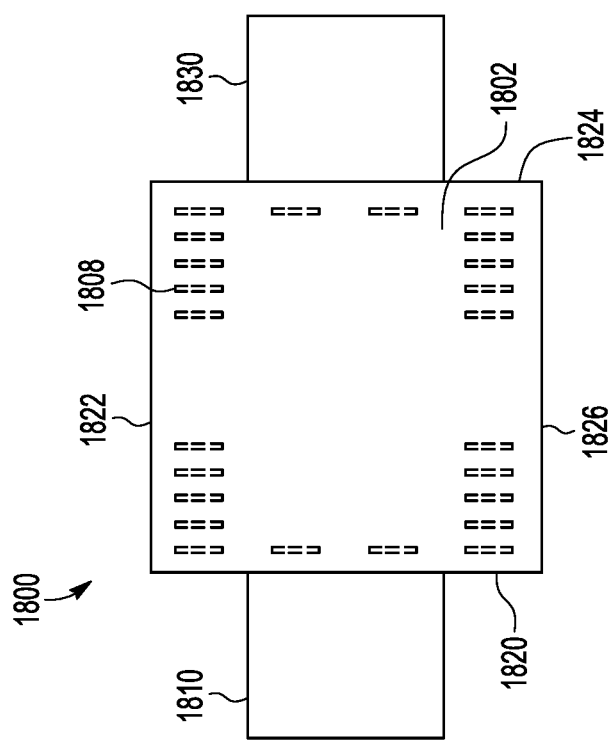
FIG. 18 is a top view of a portion of an integrated circuit device having a component and an example arrangement of TSVs, in accordance with an alternate embodiment.

FIG. 18 is a top view of a portion of an integrated circuit device 1800 having a component and an example arrangement of TSVs, in accordance with an embodiment. Illustrated, as included within the device 1800, is a first electrode 1802 (e.g., a bottom capacitor electrode) having edges 1820, 1822, 1824, and 1826, feeds 1810, 1830 coupled relative to the first electrode 1802, and a plurality of TSVs 1808 connected to an underside of the first electrode 1802. The feed 1810 has a shape of a rectangle with a first perimeter segment (in this case edge) that is connected at a center of an edge of a second electrode (e.g., a top capacitor electrode (not shown)), which is parallel to and aligned with the edge 1820 of the first electrode 1802. The feed 1810 also has second and third edges orthogonal to the first edge of the feed 1810 and orthogonal to the edge 1820, and a fourth edge orthogonal to the second and third edges and distal from the first edge of the feed 1810. A distance between the second and third edges defines a width of the feed 1810 relative to the edge 1820 of the first electrode 1802. The width of the feed in this embodiment is about half the length of the edge 1820, although the feed width may be smaller or larger with respect to the edge length. The feed 1830 has substantially the same shape and size as the feed 1810 and is connected opposite the feed 1810 at the center of an edge of the second electrode, which is parallel to and aligned with the edge 1824 of the first electrode 1802.

As mentioned earlier, the arrangement of TSVs relative to a component electrode, in accordance with embodiments described herein, is based on projected current distribution through the component electrode. Namely, when TSVs are connected to a component electrode, such as TSVs connecting a component electrode to a ground plane, the TSVs can be selectively coupled in a region of the component electrode having a relatively (i.e., as compared to other component electrode regions) higher projected current density, and substantially omitted from a region of the component electrode having a relatively lower projected current density. For example, current density distribution can be projected based on observing electromagnetic (EM) simulations.

EM simulations show that certain signals, for instance RF alternating current signals, which propagate through conductors, such as feeds and component electrodes, may create a non-uniform current flow through the conductor. Namely, current density is generally relatively higher at or near one or more of the perimeter segments, e.g., edges, of the conductor and relatively lower in some interior regions of the conductor. EM simulations further show that current density is generally relatively higher near a "coupling" edge of a component electrode, near other edges closest to (e.g., orthogonal to) the coupling edge, and in an interior region near axes that extend from the edges of the feed which are orthogonal to the coupling edge. The "coupling" edge is the edge of the component electrode that the feed is attached to (as in the case of an inductor) or that the feed is parallel to and aligned with (as in the case of a capacitor). EM simulations additionally show that current density is relatively lower near one or more edges farthest or distal from the coupling edge.

The following example general guidelines can be established, based on the above observations, for determining or defining the first region of the component electrode to which a higher density of the TSVs are coupled and the second region of the component electrode that is left substantially devoid of TSVs (or to which a significantly lower density of TSVs are coupled). Where a current feed mechanism is coupled parallel to and aligned with a coupling edge (e.g., a first perimeter segment) of a component electrode, at least some of the plurality of TSVs can be coupled to the component electrode within a perimeter region along at least a majority of the first perimeter segment of the first component electrode, and the second region, which is substantially devoid of TSVs, can include the perimeter region along at least a majority of a second opposing perimeter segment to the first perimeter segment of the component electrode.

As used herein, a perimeter region is a region that extends from the perimeter or border into an interior of the component electrode, wherein a depth to which the perimeter region extends into the interior along each perimeter segment (e.g., edge) enables the coupling of only a single series of TSVs along each perimeter segment. The depth of the perimeter region can be the same or different along each perimeter segment depending on the projected orientation of the TSVs along the perimeter segments and the projected shape of the TSVs. An interior region includes the remainder of the interior of the component electrode outside of (i.e., not included within) the perimeter region.

Examples of perimeter regions and interior regions are illustrated by reference to FIGS. 11 and 17. FIG. 17, for instance, shows a perimeter region that extends from a perimeter (defined by edges 1720, 1722, 1724, 1726) of the component electrode 1702 to a perimeter region boundary (defined by lines 1732, 1734, 1736, 1738) within an interior of the component electrode 1702. The perimeter region extends a depth $d_1$ into the interior along the edges 1720 and 1724 and extends a depth $d_2$ into the interior along the edges 1722 and 1726, which enables the coupling of only a single series of TSVs 1708 along each edge 1720, 1722, 1724, 1726, as shown. Based on the projected shape of the TSVs 1708 (e.g., an elongated cross-section with a first dimension that is longer than a second dimension) and the orientation of the TSVs 1708 along the sides 1720, 1722, 1724, 1726, the depth $d_1$ of the perimeter region along the sides 1720, 1724 is smaller than the depth $d_2$ of the perimeter region along the sides 1722, 1726. An interior region 1728 includes the remainder of the interior of the component electrode 1702 outside of (i.e., not included within) the perimeter region. The integrated circuit devices illustrated in FIGS. 14, 15, 16, and 18 have a same-sized component electrode and same-sized and shaped cross-section and orientation of TSVs as is illustrated in FIG. 17 and can, thereby, have a same-sized or substantially same-sized and shaped perimeter region and interior region as is illustrated in FIG. 17.

The integrated circuit devices illustrated in FIGS. 11, 12, and 13 have a same-sized component electrode as is illustrated in FIGS. 14 to 18. Additionally for the integrated circuit devices illustrated in FIGS. 11, 12, and 13, each of the TSVs has an elongated cross-section with a first dimension that is longer than a second dimension, as is illustrated in FIGS. 14 to 18. By contrast, however, in FIGS. 14 to 18 the first (longer) dimension of the TSVs is aligned orthogonal to the second and third perimeter segments of the current feed mechanism and parallel to the coupling perimeter segment or edge. Whereas, in FIGS. 11 to 13, the first (longer) dimension is aligned parallel to the second and third perimeter segments of the current feed mechanism and orthogonal to the coupling edge. Accordingly, in FIGS. 14 to 18 the depth (e.g., $d_1$ as shown in FIG. 17) of the perimeter region along the edges parallel to the coupling edge is shorter than the depth (e.g., $d_2$ as shown in FIG. 17) of the perimeter region along the edges orthogonal to the coupling edge. Whereas, in FIGS. 11 to 13 a depth (e.g., $d_3$ as shown in FIG. 11) of a perimeter region along the edges parallel to the coupling edge is longer than a depth (e.g., $d_4$ as shown in FIG. 17 of the perimeter region along the edges orthogonal to the coupling edge.

A further example guideline, for determining the first and second regions, is where the component electrode has third and fourth perimeter segments orthogonal to the first and second opposing perimeter segments, and some of the TSVs can be coupled within the perimeter region along at least a majority of the third and fourth perimeter segments. Additionally, where the current feed mechanism has a first perimeter segment coupled parallel to and aligned with the first perimeter segment of the first component electrode, and the current feed mechanism has second and third perimeter segments orthogonal to the first perimeter segments, the arrangement of the plurality of TSVs in the first region of the first component electrode can be based on locations of the second and third perimeter segments of the current feed mechanism relative to the first perimeter segment of the first component electrode.

Application of these general guidelines is illustrated in the example TSV arrangements of FIGS. 11 to 18. In FIGS. 17 and 18, as mentioned, the first component electrode has a shape of a parallelogram having first, second, third, and fourth edges. Moreover, the integrated circuit devices illustrated therein have feeds coupled parallel to and aligned with two opposing edges of the component electrode and, thereby, have two (e.g., first and second) opposing couplings edges. Accordingly, the first region having the plurality of TSVs coupled thereto includes the perimeter region along at least a majority of each of the first and second coupling edges and of third and fourth edges orthogonal to the first and second coupling edges. The second region that is substantially devoid of TSVs includes at least some of the interior region within the parallelogram.

For example, for the embodiment illustrated in both FIG. 17 and FIG. 18, the first region having the TSVs 1708 coupled thereto includes the entire perimeter region, and the second region that is substantially devoid of TSVs 1708 coupled thereto includes the entire interior region 1728 of the component electrode 1702. However, for the embodiment illustrated in FIG. 18, two first regions having the TSVs 1808 coupled thereto include the perimeter regions all along both coupling edges but only along at least a majority of the edges orthogonal to the coupling edges. Thus, the second region substantially devoid of the TSVs 1808 includes all of the interior region of the component electrode 1802 and a portion of the perimeter region along the sides orthogonal to the coupling edges. The portion of the perimeter region substantially devoid of the TSVs 1808 coupled thereto is that which is most distal to the feeds 1810, which can be determined so as to least affect the performance of the integrated circuit device 1800 during operation.

In FIGS. 11 to 16, a first region of the component electrode within which TSVs are coupled at a relatively-high density includes the perimeter region all along the coupling edge and the perimeter region all along the two edges closest and orthogonal to the coupling edge of the component electrode, which also includes the perimeter region at ends of the edge farthest from and opposing the coupling edge. The second adjacent region of the component electrode that is substantially devoid of TSVs being coupled thereto includes the remainder of the perimeter region along the opposing edge to the coupling edge.

However, in contrast to the embodiments of FIGS. 17 and 18, for the embodiments of FIGS. 11 to 16, the second region substantially devoid of the TSVs coupled thereto only includes part of the interior region of the component electrode. In general, the first region, which includes the TSVs coupled thereto, also includes a portion of the interior region of the component electrode. In general, coupling of the TSVs within the interior region is based on locations of the two edges of the feed relative to the coupling edge of the component electrode, to which the two edges are orthogonal. More particularly, the TSVs are coupled near axes (not shown) that extend from an end of each edge of the feed into the interior region of the component electrode. This results in "lobes" of relatively-dense TSVs that extend into the interior region of the component electrode. As used herein, a "lobe" of TSVs refers to a normal distribution function-shaped or half normal distribution function-shaped distribution of TSVs extending from a coupling edge into the interior region of the component electrode. According to some embodiments, the maximum depth from the coupling edge that a lobe extends into the interior region is substantially aligned with the axis extending from an edge of the feed that is orthogonal to the coupling edge. Additional general guidelines can be constructed for designating the first region to which TSVs are to be coupled and the second region where no TSVs (or a substantially lower density of TSVs) are coupled to the component electrode. For example, the first region could further include a section of the interior region directly adjacent to the perimeter region along the coupling edge, as shown in FIGS. 14, 15, and 16.

Additional factors can be used to further fine-tune how to distribute the TSVs near the two axes extending from the feed edges into the interior region of the component electrode. These factors can include, but are not limited to operating frequency when the integrated circuit device is operational and/or a property of material used to construct the first component electrode. More particularly, non-uniform current density in a conductor has been observed to accumulate current on an outer edge of a conductor carrying the current due to skin effect and to accumulate current close to nearby conductor flowing current in the same direction due to proximity effect. Namely, skin effect is the tendency of an alternating electric current to become distributed within a conductor such that the current density is largest near the surface of the conductor, and decreases with greater depths in the conductor. The electric current flows mainly at the "skin" of the conductor, between the outer surface and a level called the skin depth. The non-uniform current density due to skin effect depends on the frequency of operation and the metal conductivity.

Moreover, in a first conductor carrying alternating current, if currents are flowing through one or more other nearby conductors (such to a component electrode (e.g., the first conductor) from a feed), the distribution of current within the first conductor will be constrained to smaller regions. The resulting current crowding is termed as the proximity effect. This crowding gives an increase in the effective resistance of the circuit, which increases with operating frequency. Thus, the non-uniform current density due to proximity effect depends on the frequency, but also has been observed to depend on material properties of the conductor and separation between nearby conductors.

Using a heuristic method and equations associated with skin and proximity effects, for instance, one or more functions can be constructed to determine the first region, including the portion of the internal region, for coupling a relatively high density of the TSVs to the component electrode. An example of such a function is:

$$\delta = 1/(\pi \mu_0 f \sigma)^{1/2},\qquad(1)$$

where $\delta$ is skin depth at the operating frequency, $\mu_0$ is permeability of free space, f is operating frequency, and $\sigma$ is conductivity (e.g., the material property) of the metal used to construct the component electrode.

Application of the function (1) to determine the boundaries of the first region for coupling a relatively high density of the TSVs to the component electrode is illustrated by reference to the embodiments shown in FIGS. 11, 12, and 13. For example, for the embodiments of FIGS. 11 and 12, where the width of the feed (1110 in FIG. 11, 1210 in FIG. 12) is less than the length of the coupling edge (1120 in FIG. 11, 1220 in FIG. 12), TSVs (1108 in FIG. 11, 1208 in FIG. 12) are coupled within 10$\delta$ from the edges at a high density, except for the edge opposite the coupling edge. TSVs are also coupled within part of the interior region defined by a normal distribution function (1134 in FIGS. 11, 1234 and 1236 in FIG. 12) centered at the feed edges (1130, 1132 in FIG. 11, 1230, 1232 in FIG. 12) orthogonal to the coupling edge. For the embodiment of FIG. 13, where the width of the feed 1310 is the same as the length of the coupling edge 1320, the normal distribution function 1334, 1336 is centered at the edges 1322, 1326 of the component electrode 1302, such that only half of the normal distribution function defines the first region. For this example, the normal distribution function has a peak at 206 and a standard deviation of 10$\delta$/6. However, the distribution function can be adjusted to have a different peak and/or standard deviation, and other distribution functions can be determined, which can maintain desirable operating parameters for the integrated circuit device.

Figure 19:
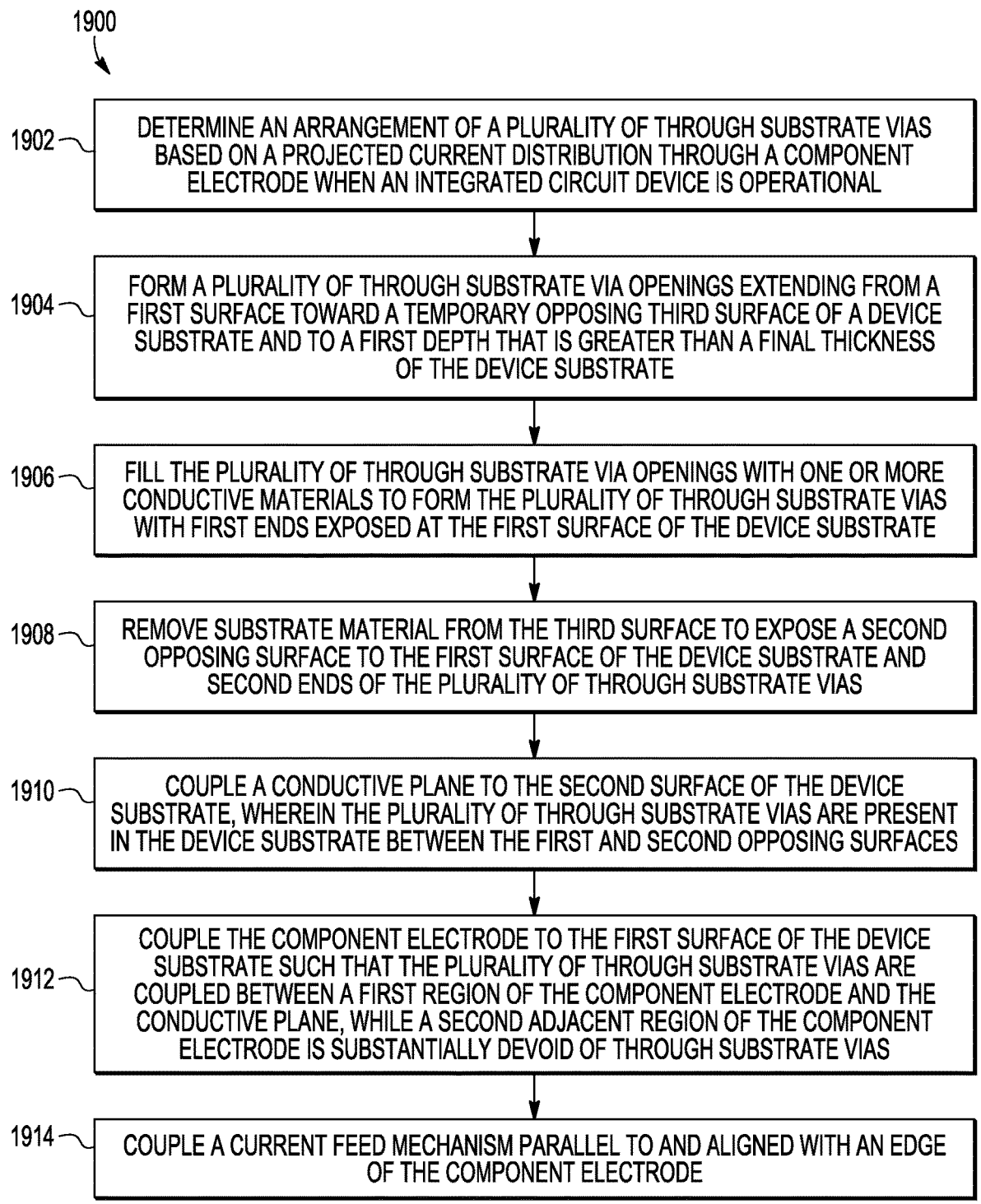
FIG. 19 is a flowchart of an example method of manufacturing an integrated circuit device with at least one component and an arrangement of TSVs, in accordance with an embodiment.

FIG. 19 is a flowchart of an example method 1900 of manufacturing an integrated circuit device with at least one component and an arrangement of TSVs, in accordance with an embodiment. The method 1900 can be performed, for example, as part of a semiconductor manufacturing process to manufacture ICs having one or more components including, but not limited to, one or more transistors, capacitors, and inductors. For a particular example, the method 1900 is used as part of a manufacturing process to manufacture IC devices such as those described above by reference to FIGS. 2 to 18.

The method 1900 includes determining 1902 an arrangement of a plurality of TSVs based on a projected current distribution through a component electrode of an IC device, when the IC device is operational. As discussed previously, the determined arrangement includes an arrangement in which a relatively high density of TSVs are to be coupled to a first electrode region that is directly adjacent to a feed connection, and a relatively low density of TSVs (or no TSVs) are to be coupled to a second electrode region that is adjacent to the first electrode region. The determining 1902 can be performed a priori using computer software based, for example, on the above-described general guidelines and/or distribution functions. The TSVs are then formed based on the TSV arrangement determined, in block 1902.

For example, a subtractive metal process can be used to pattern the TSVs. Alternately, a damascene process can be used to pattern the TSVs, for instance as described by reference to blocks 1904, 1906, and 1908 of the method 1900. More particularly, in accordance with block 1904, a plurality of TSV openings (also known as open trenches) are patterned in a device substrate where the TSVs should be located. The openings extend from a first surface toward a temporary third surface of the device substrate to a first depth that is greater than a final thickness of the device substrate.

At block 1906, the plurality of TSV openings are filled with one or more conductive materials such as copper, tungsten, or alloys thereof, to form the TSVs such that first ends of the TSVs are exposed at the first surface of the device substrate. For an embodiment, a thick coating of the conductive material significantly overfills the TSV openings and is deposited on top of the device substrate. Thereafter, chemical-mechanical planarization (CMP), or some other material removal method, can be used to remove the conductive material (known as overburden) that extends above the top of the device substrate. Conductive material sunken within the TSV openings of the device substrate is not removed and, thereby, becomes the patterned TSVs.

In a further embodiment, a barrier material layer coats the TSV openings before the conductive material is added to prevent or limit diffusion of the conductive metal into the substrate material to conductively isolate the TSVs. Additionally, at block 1908, substrate material is removed, e.g., etched, from the temporary third surface to expose a second surface of the device substrate and second ends of the plurality of TSVs. For an embodiment, the final thickness of the device substrate between the first and second surfaces is in a range of about 1.5 to 3 mils.

For a particular implementation, each TSV has an elongated or trench-like cross-sectional shape having a first dimension (length) that is longer than a second dimension (width). For one embodiment, the width to length ratio of each TSV is at least 1:5. In another embodiment, the width to length ratio of each TSV is at least 1:10. According to a particular embodiment, the width of each TSV is in a range of about 1 micron to about 4 microns, and a length of each TSV is in a range of about 20 microns to about 40 microns. In a further embodiment, the width of each TSV is in a range of about 2 microns to about 3 microns, and a length of each TSV is in a range of about 25 microns to about 30 microns. TSVs may have larger or smaller widths and/or lengths, as well.

A conductive layer is deposited on the second surface of the device substrate to couple 1910 a conductive plane to the second surface of the device substrate. One or more additional layers of conductive and insulating materials can be deposited over the first surface of the device substrate from which a component electrode is formed (e.g., etched) and, thereby, coupled 1912 to the first surface of the device substrate such that the plurality of TSVs (formed in the device substrate) are coupled between the conductive plane and a first region of the component electrode, while a second adjacent region of the component electrode is substantially devoid of TSVs. The additional layers of conductive and insulating material can be further etched or patterned to form additional structures on the device substrate such as one or more components (including a component that having the component electrode with the TSVs coupled thereto) and interconnects, including a current feed mechanism coupled 1914 parallel to and aligned with an edge of the component electrode.

The preceding detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or detailed description.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. An integrated circuit device comprising:
    a device substrate having first and second opposing surfaces;
    a first component electrode coupled to the first surface, the first component electrode comprising a substantially continuous electrically-conductive plane having a first edge, a second edge opposite the first edge as taken along a first axis extending parallel to the first surface of the device substrate, a third edge extending from the first edge to the second edge, and a fourth edge extending from the first edge to the second edge, the fourth edge opposite the third edge as taken along a second axis extending parallel to the first surface and perpendicular to the first axis;
    a conductive plane coupled to the second surface;
    a plurality of through substrate vias each having a first end directly connected to the first component electrode and a second end directly connected to the conductive plane such that through substrate via extends perpendicularly between the first component electrode and the conductive plane, the plurality of through substrate vias electrically coupling a first region of the first component electrode to the conductive plane through the device substrate, wherein a second adjacent region of the first component electrode is substantially devoid of through substrate vias; and
    a current feed mechanism electrically coupled to the first component electrode and positioned to direct current into the first component electrode through the first edge thereof, the first region of the first component electrode located between the second region of the first component electrode and the current feed mechanism as taken along the first axis;
    wherein the plurality of through substrate vias is distributed in a non-uniform arrangement corresponding, at least in substantial part, to a current distribution through the component electrode when current is directed into the first component electrode by the current feed mechanism during operation of the integrated circuit device; and wherein an average density of the through substrate vias, as taken from the third edge moving toward the fourth edge, decreases with increasing distance from the current feed mechanism.

2. The integrated circuit device of claim 1, wherein the first component electrode comprises a first perimeter segment, and the current feed mechanism is coupled parallel to and aligned with the first perimeter segment.

3. The integrated circuit device of claim 2, wherein at least some of the plurality of through substrate vias are coupled within a perimeter region along at least a majority of the first perimeter segment of the first component electrode.

4. The integrated circuit device of claim 3, wherein the second region, which is substantially devoid of through substrate vias, comprises the perimeter region along at least a majority of a second opposing perimeter segment to the first perimeter segment of the first component electrode.

5. The integrated circuit device of claim 4, wherein the first component electrode has third and fourth perimeter segments orthogonal to the first and second perimeter segments, wherein some of the through substrate vias are coupled within the perimeter region along at least a majority of the third and fourth perimeter segments.

6. The integrated circuit device of claim 2, wherein the current feed mechanism has a first perimeter segment coupled parallel to and aligned with the first perimeter segment of the first component electrode, and the current feed mechanism has second and third perimeter segments orthogonal to the first perimeter segments, wherein the arrangement of the plurality of through substrate vias in the first region of the first component electrode is based on locations of the second and third perimeter segments of the current feed mechanism relative to the first perimeter segment of the first component electrode.

7. The integrated circuit device of claim 6, wherein each of the through substrate vias has an elongated cross-section with a first dimension that is longer than a second dimension, wherein the first dimension is aligned parallel to the second and third perimeter segments of the current feed mechanism.

8. The integrated circuit device of claim 6, wherein each of the through substrate vias has an elongated cross-section with a first dimension that is longer than a second dimension, wherein the first dimension is aligned orthogonal to the second and third perimeter segments of the current feed mechanism.

9. The integrated circuit device of claim 2, wherein the arrangement of the plurality of through substrate vias in the first region is based on one or more of:
    operating frequency when the integrated circuit device is operational;
    skin depth at the operating frequency; and
    a property of material used to construct the first component electrode.

10. The integrated circuit device of claim 1 further comprising a second component electrode and a dielectric component coupled between the first and second component electrodes.

11. The integrated circuit device of claim 1 further comprising a conductive coil, wherein the current feed mechanism and the conductive coil are coupled to the first component electrode.

12. The integrated circuit device of claim 1, wherein the first component electrode and the conductive plane are positioned parallel to each other, and the plurality of through substrate vias are positioned orthogonal to the first component electrode and the conductive plane with first ends of the plurality of through substrate vias connected to the first component electrode in the first region and second ends of the plurality of through substrate vias connected to the conductive plane.

13. The integrated circuit device of claim 1, wherein the first component electrode has a shape of a parallelogram having first, second, third, and fourth edges, wherein the first region having the plurality of through substrate vias coupled thereto comprises a perimeter region along at least a majority of each of the first, second, third, and fourth edges, and the second region that is substantially devoid of through substrate vias comprises at least some of an interior region within the parallelogram.

14. An integrated circuit device comprising:
    a device substrate having a first surface and a second opposing surface;
    a component electrode coupled to the first surface of the device substrate, the component electrode comprising:
    a first edge;
    a second edge opposite the first edge as taken along a first axis extending parallel to the first surface of the device substrate;
    a third edge extending from the first edge to the second edge; and
    a fourth edge extending from the first edge to the second edge, the fourth edge opposite the third edge as taken along a second axis extending parallel to the first surface of the device substrate and perpendicular to the first axis;

a current feed mechanism electrically coupled to the component electrode and positioned to direct current into the component electrode through the first edge thereof, the current feed mechanism comprising opposing feed edges parallel to the first axis;

a conductive plane coupled to the second surface of the device substrate;

through substrate vias (TSVs) extending through the device substrate to electrically couple the component electrode to the conductive plane, the TSVs arranged in a plurality of TSV rows extending from the first edge of the component electrode toward the second edge thereof, the plurality of TSV rows comprising:

a first TSV row extending adjacent and parallel to the third edge of the component electrode;

a second TSV row extending adjacent and parallel to the fourth edge of the component electrode; and at least one additional TSV row located between the first and second TSV rows, the at least one additional TSV row containing fewer TSVs than does the first row of TSVs and containing fewer TSVs than does the second row of TSVs;

wherein the TSVs are distributed have a minimum density in a first region extending from the first edge to the second edge of the component electrode;

wherein the TSVs are further distributed to have densities greater than the minimum density at locations aligned with the opposing feed edges of the current feed mechanism as taken along the first axis.

15. The integrated circuit device of claim 14, wherein the first TSV row and the second TSV row each extend from a location adjacent the first edge of the component electrode to a location adjacent the second edge of the component electrode.

16. The integrated circuit device of claim 14, wherein the plurality of TSVs is distributed in a non-uniform arrangement such that an average density of the TSVs, as taken from the third edge to the fourth edge of the component electrode, decreases with increasing distance from the current feed mechanism.

* * * * *